(12) United States Patent
Adachi

(10) Patent No.: US 11,971,537 B2
(45) Date of Patent: Apr. 30, 2024

(54) LIGHT DEFLECTION DEVICE, DISTANCE MEASUREMENT DEVICE, AND MOBILE BODY

(71) Applicant: Kazuhiko Adachi, Miyagi (JP)

(72) Inventor: Kazuhiko Adachi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 1246 days.

(21) Appl. No.: 16/590,497

(22) Filed: Oct. 2, 2019

(65) Prior Publication Data

US 2020/0174249 A1 Jun. 4, 2020

(30) Foreign Application Priority Data

Nov. 29, 2018 (JP) .................. 2018-223369

(51) Int. Cl.
| | | |
|---|---|---|
| *G02B 26/08* | (2006.01) | |
| *F21S 41/16* | (2018.01) | |
| *F21S 41/176* | (2018.01) | |
| *F21S 41/32* | (2018.01) | |
| *F21S 41/675* | (2018.01) | |
| *G01S 7/481* | (2006.01) | |
| *G02B 26/10* | (2006.01) | |
| *G02B 27/01* | (2006.01) | |
| *B60K 35/23* | (2024.01) | |
| *G06F 1/16* | (2006.01) | |

(52) U.S. Cl.
CPC ........ *G02B 26/0858* (2013.01); *F21S 41/16* (2018.01); *F21S 41/176* (2018.01); *F21S 41/321* (2018.01); *F21S 41/675* (2018.01); *G01S 7/4813* (2013.01); *G01S 7/4817* (2013.01); *G02B 26/0833* (2013.01); *G02B 26/101* (2013.01); *G02B 27/0101* (2013.01); *B60K 35/23* (2024.01); *B81B 2201/042* (2013.01); *B81B 2203/058* (2013.01); *G02B 26/105* (2013.01); *G06F 1/163* (2013.01)

(58) Field of Classification Search
CPC ................................................ G02B 26/0858
See application file for complete search history.

(56) References Cited

U.S. PATENT DOCUMENTS

| | | |
|---|---|---|
| 2003/0104651 A1 | 6/2003 | Kim et al. |
| 2004/0021924 A1 | 2/2004 | Yasuda |
| 2007/0041597 A1 | 2/2007 | Song |

(Continued)

FOREIGN PATENT DOCUMENTS

| | | |
|---|---|---|
| EP | 0866351 | 9/1998 |
| JP | H10-260370 | 9/1998 |

(Continued)

OTHER PUBLICATIONS

Office Action for JP2018-223369 mailed on May 10, 2022.

*Primary Examiner* — Edmond C Lau
(74) *Attorney, Agent, or Firm* — IPUSA, PLLC

(57) ABSTRACT

A light deflection device includes a substrate including a planar portion and a recess; a spacer member disposed at a bottom of the recess; a supporting section disposed on the spacer member; a movable part rotatably supported by the supporting section and having a reflecting surface configured to reflect light at a height equal to or higher than a height of the planar portion; and a light transmissive member disposed on the planar portion and covering the movable part.

10 Claims, 29 Drawing Sheets

(56) References Cited

U.S. PATENT DOCUMENTS

| | | | | |
|---|---|---|---|---|
| 2014/0132187 A1* | 5/2014 | Mori | ............... | G02B 7/1821 |
| | | | | 318/128 |
| 2015/0040368 A1* | 2/2015 | Quenzer | ............ | G02B 27/0006 |
| | | | | 29/428 |
| 2019/0250270 A1 | 8/2019 | Suzuki et al. | | |

FOREIGN PATENT DOCUMENTS

| | | |
|---|---|---|
| JP | 2003-243550 | 8/2003 |
| JP | 2004-102249 | 4/2004 |
| JP | 2007-060661 | 3/2007 |
| JP | 2010-060689 | 3/2010 |
| JP | 2010-122412 | 6/2010 |
| JP | 3162282 | 8/2010 |
| JP | 2012-145753 | 8/2012 |
| JP | 2016-014741 | 1/2016 |
| JP | 2017-227754 | 12/2017 |
| JP | 2018-022004 | 2/2018 |
| JP | 2019-138805 | 8/2019 |

\* cited by examiner

LIGHT DEFLECTION DEVICE, DISTANCE MEASUREMENT DEVICE, AND MOBILE BODY

CROSS-REFERENCE TO RELATED APPLICATIONS

This patent application is based on and claims priority pursuant to 35 U.S.C. § 119(a) to Japanese Patent Application No. 2018-223369, filed on Nov. 29, 2018, in the Japan Patent Office, the entire disclosure of which is hereby incorporated by reference herein.

BACKGROUND

Technical Field

The present disclosure relates to a light deflection device, a distance measurement device, and a mobile body.

Related Art

In recent years, with the development of micromachining technology applying semiconductor manufacturing technology, development of micro electro mechanical systems (MEMS) devices manufactured by micromachining silicon or glass is advancing.

As a MEMS device, there is known a movable device that includes a drive beam including an elastic beam and a movable part having a reflecting surface, which are combined as a single unit on a wafer, and that drives (rotates) the movable part using the drive beam. In addition, for example, to prevent dusts from adhering to the reflecting surface and the movable part, there is known a packaged movable device (hereinafter, referred to as light deflection device) including a light transmissive member such as glass serving as a window portion.

SUMMARY

A light deflection device according to one aspect of the present disclosure includes a substrate including a planar portion and a recess; a spacer member disposed at a bottom of the recess; a supporting section disposed on the spacer member; a movable part rotatably supported by the supporting section and having a reflecting surface configured to reflect light at a height equal to or higher than a height of the planar portion; and a light transmissive member disposed on the planar portion and covering the movable part.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

Figure 1:
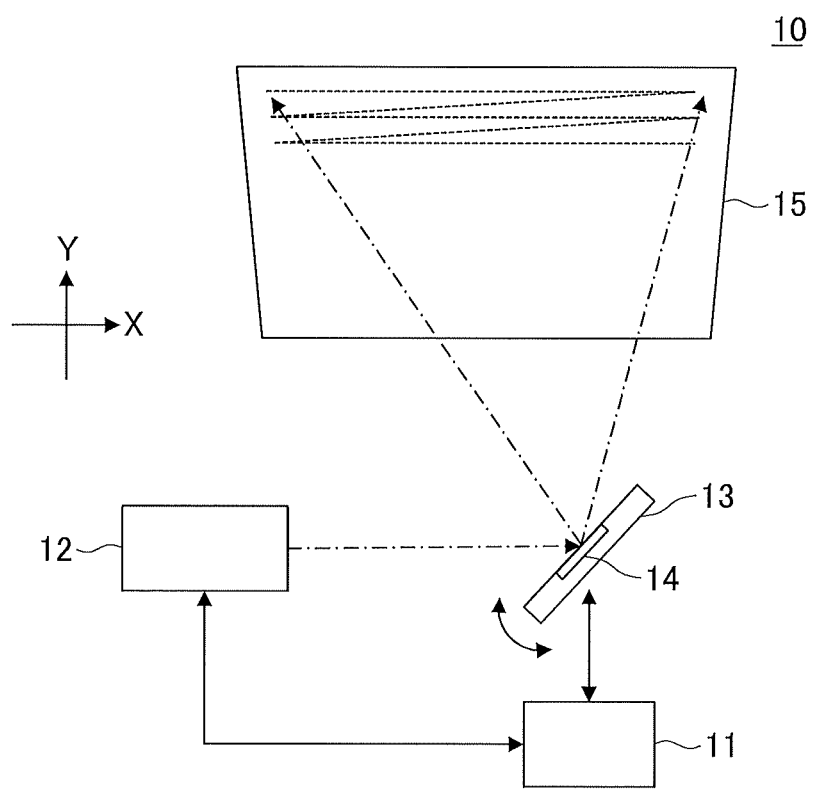
FIG. 1 is a schematic view of an example of an optical scanning system.

The accompanying drawings are intended to depict embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Embodiments of the present disclosure are described below in detail.

An optical scanning system to which a movable device of an embodiment is applied is described in detail referring to FIGS. 1 to 4.

FIG. 1 is a schematic view of an example of an optical scanning system 10. As illustrated in FIG. 1, the optical scanning system 10 deflects light emitted from a light-source device 12 under the control of a control device 11, by using a reflecting surface 14 included in a movable device 13, so as to optically scan a target surface 15 to be scanned (hereinafter, referred to as target surface).

The optical scanning system 10 includes the control device 11, the light-source device 12, and the movable device 13 having the reflecting surface 14.

The control device 11 is, for example, an electronic circuit unit including, for example, a central processing unit (CPU) and a field-programmable gate array (FPGA). The movable device 13 is, for example, a micro electro mechanical systems (MEMS) device that includes a reflecting surface 14 and that can move the reflecting surface 14. The light-source device 12 is, for example, a laser device that emits a laser beam. The target surface 15 is, for example, a screen.

The control device 11 generates control instructions of the light-source device 12 and the movable device 13 based on acquired optical-scanning information, and outputs drive signals to the light-source device 12 and the movable device 13 based on the control instructions.

The light-source device 12 emits light based on the received drive signal. The movable device 13 moves the reflecting surface 14 in at least one of a uniaxial direction and a biaxial direction, based on the received drive signal.

With this configuration, for example, the reflecting surface 14 of the movable device 13 is biaxially moved in a reciprocating manner within a predetermined range, and the light emitted from the light-source device 12 to be incident on the reflecting surface 14 is uniaxially deflected to perform optical scanning, under the control of the control device 11, which is based on image data that is an example of the optical-scanning information. Accordingly, an image can be projected onto the target surface 15 as desired. The details of the movable device and the details of the control of the control device according to the embodiment are described later.

Figure 2:
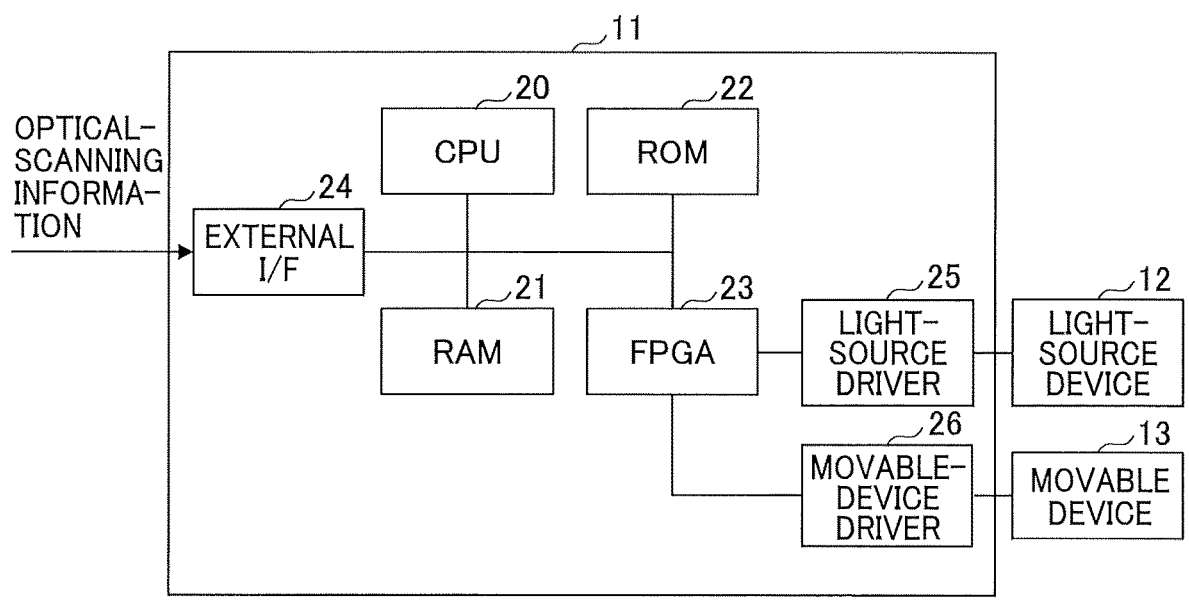
FIG. 2 is a hardware block diagram of the example of the optical scanning system.

Next, the hardware configuration of an example of the optical scanning system 10 is described referring to FIG. 2. FIG. 2 is a hardware block diagram of the example of the optical scanning system 10. As illustrated in FIG. 2, the optical scanning system 10 includes the control device 11, the light-source device 12, and the movable device 13, which are electrically connected to one another. The control device 11 includes a CPU 20, a random access memory (RAM) 21, a read only memory (ROM) 22, a FPGA 23, an external interface (I/F) 24, a light-source driver 25, and a movable-device driver 26.

The CPU 20 is an arithmetic device that loads into the RAM 21 a program or data from a storage device such as the ROM 22 and executes processing to provide the controls or functions of the entirety of the control device 11.

The RAM 21 is a volatile storage device that temporarily holds a program and data.

The ROM 22 is a non-volatile storage device that can hold a program and data even after the power is turned off, and stores a program and data for processing that is executed by the CPU 20 to control each function of the optical scanning system 10.

The FPGA 23 is a circuit that outputs proper control signals to the light-source driver 25 and the movable-device driver 26 in accordance with the processing performed by the CPU 20.

For example, the external I/F 24 is an interface with respect to an external device or a network. The external device may be, for example, a host device such as a personal computer (PC); or a storage device, such as a universal serial bus (USB) memory, a secure digital (SD) card, a compact disk (CD), a digital versatile disk (DVD), a hard disk drive (HDD), or a solid state drive (SSD). For example, the network may be a controller area network (CAN) of a vehicle, a local area network (LAN), or the Internet. The external I/F 24 can have any configuration that can achieve connection to an external device or communication with an external device. The external I/F 24 may be provided for each external device.

The light-source driver 25 is an electric circuit that outputs a drive signal such as a drive voltage to the light-source device 12 in accordance with the received control signal.

The movable-device driver 26 is an electric circuit that outputs a drive signal such as a drive voltage to the movable device 13 in accordance with the received control signal.

In the control device 11, the CPU 20 acquires optical-scanning information from an external device or a network through the external I/F 24. As far as the CPU 20 can acquire the optical-scanning information, the optical-scanning information may be stored in the ROM 22 or the FPGA 23 in the control device 11. Alternatively, a storage device such as a SSD may be additionally provided in the control device 11 and the optical-scanning information may be stored in the storage device.

In this case, the optical-scanning information is information indicating the way of optical scanning to be performed on the target surface 15. For example, the optical-scanning information is image data when an image is displayed by optical scanning. For another example, the optical-scanning information is writing data indicating the order and portion of writing when optical writing is performed by optical scanning. For further example, the optical-scanning information is irradiation data indicating the timing and range of irradiation with light for distance measurement when distance measurement is performed by optical scanning.

The control device 11 can provide the functional configuration described below by using instructions from the CPU 20 and the hardware configuration illustrated in FIG. 2.

Figure 3:
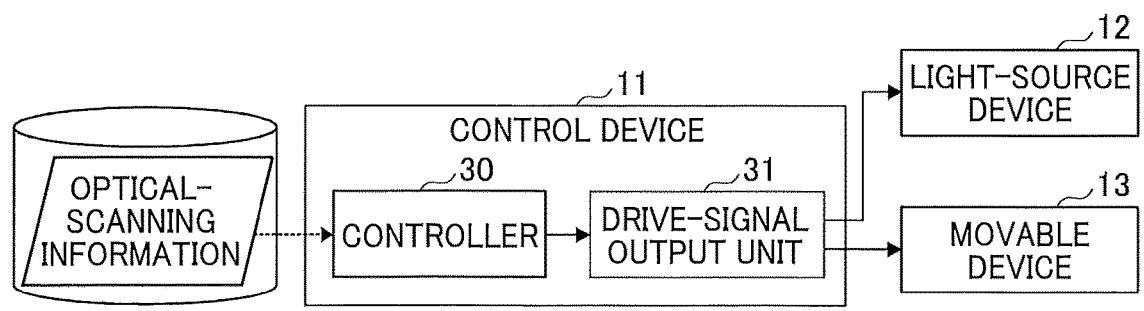
FIG. 3 is a functional block diagram of an example of a control device.

Next, the functional configuration of the control device 11 of the optical scanning system 10 is described below referring to FIG. 3. FIG. 3 is a functional block diagram of an example of the control device 11 of the optical scanning system 10.

As illustrated in FIG. 3, the control device 11 includes a controller 30 and a drive-signal output unit 31 as functions.

The controller 30 is implemented by, for example, the CPU 20, the FPGA 23, and the like. The controller 30 acquires optical-scanning information from an external device, converts the optical-scanning information into a control signal, and outputs the control signal to the drive-signal output unit 31. For example, the controller 30 acquires image data serving as the optical-scanning information from an external device or the like, generates a control signal from the image data through predetermined processing, and outputs the control signal to the drive-signal output unit 31.

The drive-signal output unit 31 is implemented by, for example, the light-source driver 25 and the movable-device driver 26. The drive-signal output unit 31 outputs a drive signal to the light-source device 12 or the movable device 13 based on the received control signal.

The drive signal is a signal for controlling the driving of the light-source device 12 or the movable device 13. For example, the drive signal of the light-source device 12 is a drive voltage used to control the irradiation timing and irradiation intensity of the light source. Moreover, for example, the drive signal of the movable device 13 is a drive voltage used to control the timing at which the reflecting surface 14 included in the movable device 13 is moved and the movable range of the reflecting surface 14.

Figure 4:
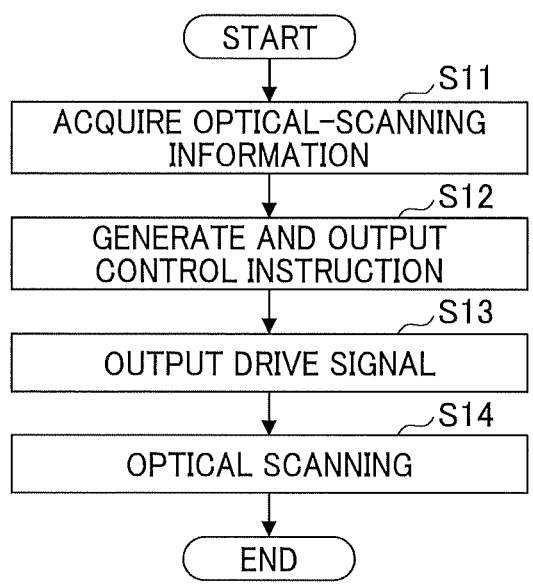
FIG. 4 is a flowchart of an example of processing relating to the optical scanning system.

Next, the process of optically scanning the target surface 15 performed by the optical scanning system 10 is described referring to FIG. 4. FIG. 4 is a flowchart of an example of processing performed by the optical scanning system 10.

In step S11, the controller 30 acquires optical-scanning information from, for example, an external device.

In step S12, the controller 30 generates control signals from the acquired optical-scanning information, and outputs the control signals to the drive-signal output unit 31.

In step S13, the drive-signal output unit 31 outputs drive signals to the light-source device 12 and the movable device 13 based on the received control signals.

In step S14, the light-source device 12 emits light based on the received drive signal. In addition, the movable device 13 moves the reflecting surface 14 based on the received drive signal. The driving of the light-source device 12 and the movable device 13 causes light to be deflected in any desired direction, and optical scanning is performed.

In the above-described optical scanning system 10, a single control device 11 has a device and a function for controlling the light-source device 12 and the movable device 13. However, a control device for the light-source device and a control device for the movable device may be separate elements.

In the above-described optical scanning system 10, a single control device 11 has the functions of the controller 30 and the functions of the drive-signal output unit 31 for the light-source device 12 and the movable device 13. These functions may be implemented by separate elements. For example, a drive-signal output device including a drive-signal output unit 31 may be provided in addition to the control device 11 including the controller 30. An optical deflection system that performs optical deflection may include the movable device 13 including the reflecting surface 14 and the control device 11 of the above-described optical scanning system 10.

Image Projection Apparatus

An image projection apparatus, to which the movable device according to the embodiment is applied, is described next in detail referring to FIGS. 5 and 6.

Figure 5:
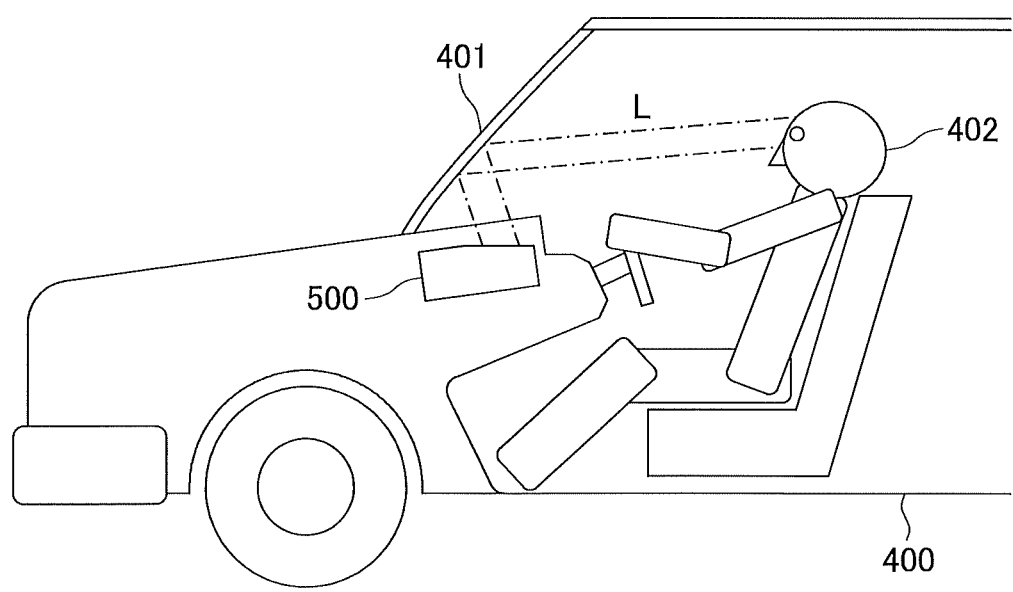
FIG. 5 is a schematic view of an example of a vehicle equipped with a head-up display device (HUD)

FIG. 5 is a schematic view of a vehicle 400 equipped with a head-up display (HUD) 500 as an example of an image projection apparatus according to the embodiment. FIG. 6 is a schematic view of an example of the HUD 500.

The image projection apparatus is an apparatus that projects an image by optical scanning, and is, for example, a HUD.

As illustrated in FIG. 5, for example, the HUD 500 is disposed, for example, near a windshield 401 of the vehicle 400. Projection light L that is emitted from the HUD 500 is reflected by the windshield 401 and directed to an observer (a driver 402) as a user. Accordingly, the driver 402 can visually recognize an image or the like projected by the HUD 500, as a virtual image. Alternatively, a combiner may be disposed on the inner wall surface of the windshield 401 so that the user can visually recognize a virtual image formed by the projection light that is reflected by the combiner.

Figure 6:
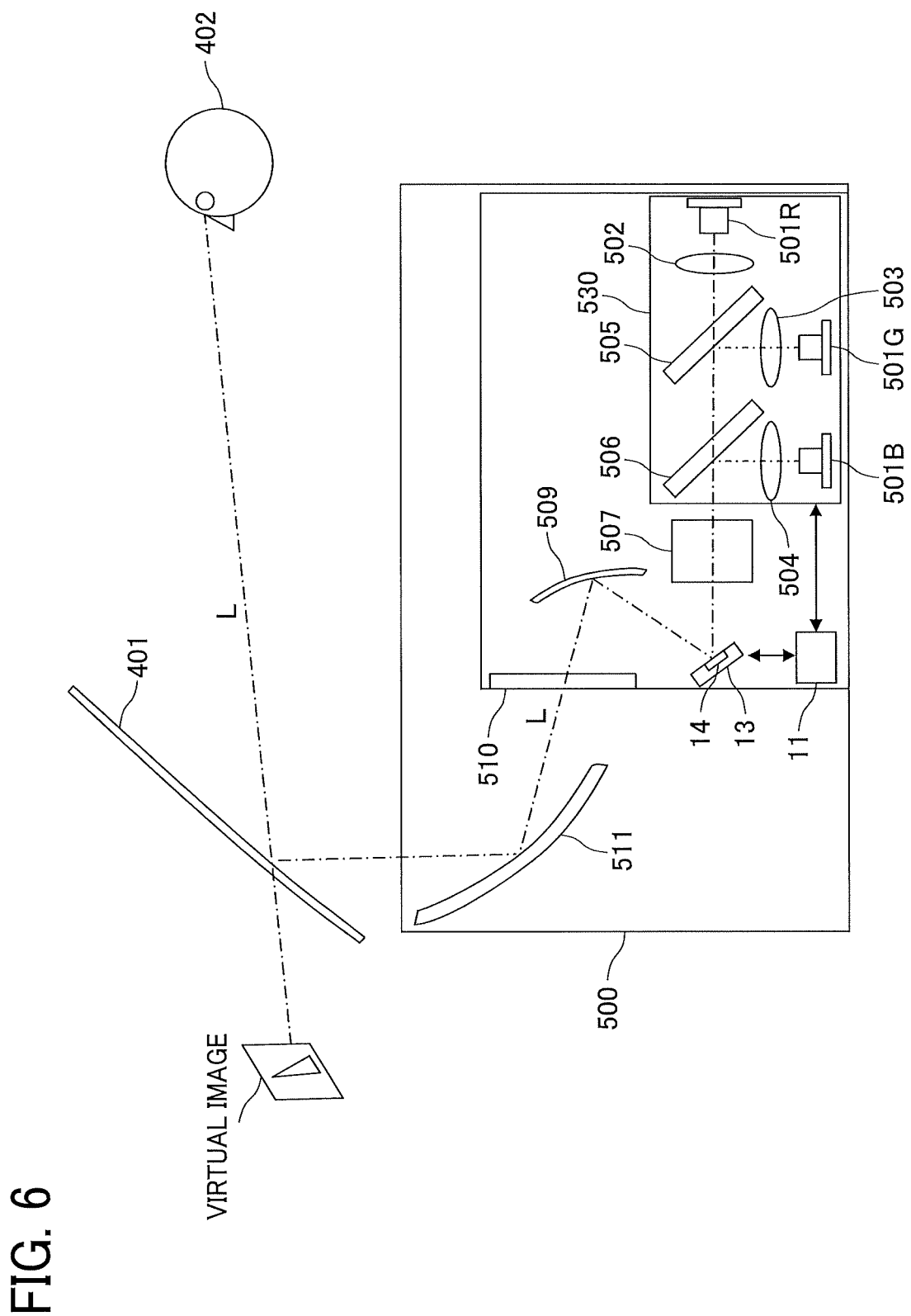
FIG. 6 is a schematic view of an example of the HUD.

As illustrated in FIG. 6, the HUD 500 emits laser beams from red, green, and blue laser-beam sources 501R, 501G, and 501B. The emitted laser beams pass through an incidence optical system, and then are deflected by the movable device 13 including the reflecting surface 14. The incidence optical system includes collimator lenses 502, 503, and 504 respectively provided for the laser-beam sources 501R, 501G, and 501B, two dichroic mirrors 505 and 506, and a light-intensity adjuster 507. The deflected laser beams pass through a projection optical system, and are projected onto a screen. The projection optical system includes a free-form surface mirror 509, an intermediate screen 510, and a projection mirror 511. In the HUD 500, the laser-beam sources 501R, 501G, and 501B, the collimator lenses 502, 503, and 504, and the dichroic mirrors 505 and 506 are combined as a single unit, that is, a light-source unit 530 in an optical housing.

The HUD 500 projects an intermediate image displayed on the intermediate screen 510 onto the windshield 401 of the vehicle 400 to allow the driver 402 to visually recognize the intermediate image as a virtual image.

The laser beams of RGB colors emitted from the laser-beam sources 501R, 501G, and 501B are collimated by the collimator lenses 502, 503, and 504 into approximately parallel beams, and are combined by the two dichroic mirrors 505 and 506. The light intensity of the combined laser beams is adjusted by the light-intensity adjuster 507, and then two-dimensional scanning is performed by the movable device 13 having the reflecting surface 14. The projection light L used for two-dimensional scanning by the movable device 13 is reflected by the free-form surface mirror 509 so as to correct the distortion, and then is collected and focused onto the intermediate screen 510. Accordingly, an intermediate image is displayed. The intermediate screen 510 includes a microlens array in which a plurality of microlenses are two-dimensionally arranged, and enlarges the projection light L incident on the intermediate screen 510 in units of microlenses.

The movable device 13 moves the reflecting surface 14 biaxially in a reciprocating manner to perform two-dimensional scanning with the projection light L incident on the reflecting surface 14. The driving of the movable device 13 is controlled in synchronization with the light-emitting timings of the laser-beam sources 501R, 501G, and 501B.

The HUD 500 is described above as an example of the image projection apparatus. However, no limitation is indicated thereby, and the image projection apparatus may be any apparatus that performs optical scanning, using the movable device 13 having the reflecting surface 14, to project an image. For example, the present disclosure is also applicable to a projector that is placed on a desk or the like and projects an image on a display screen, a head-mounted display device that is incorporated in a wearable member on the head of the observer, for example, and that projects an image on a reflective-and-transmissive screen of the wearable member or on an eyeball as a screen, and the like.

The image projection apparatus may be incorporated in, not only the vehicle or the wearable member, but also, for example, a mobile body such as an aircraft, a ship, or a mobile robot; or an immobile body such as an operation robot that operates a driving target such as a manipulator without moving from the installed location.

Optical Writing Device

Figure 7:
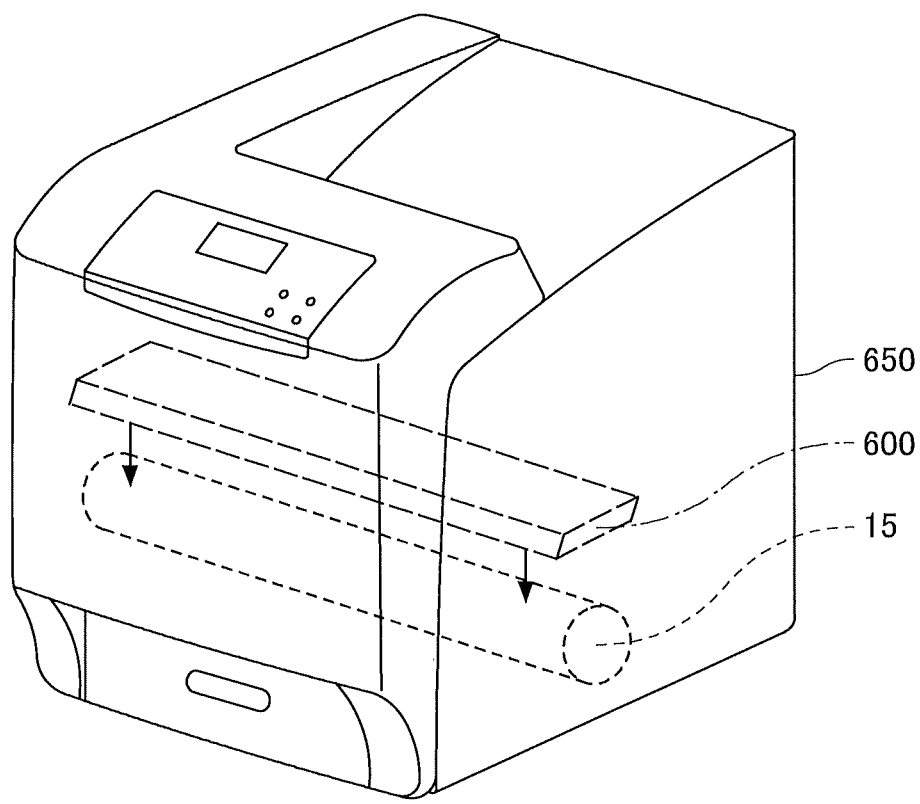
FIG. 7 is a schematic view of an example of an image forming apparatus equipped with an optical writing device.
Figure 8:
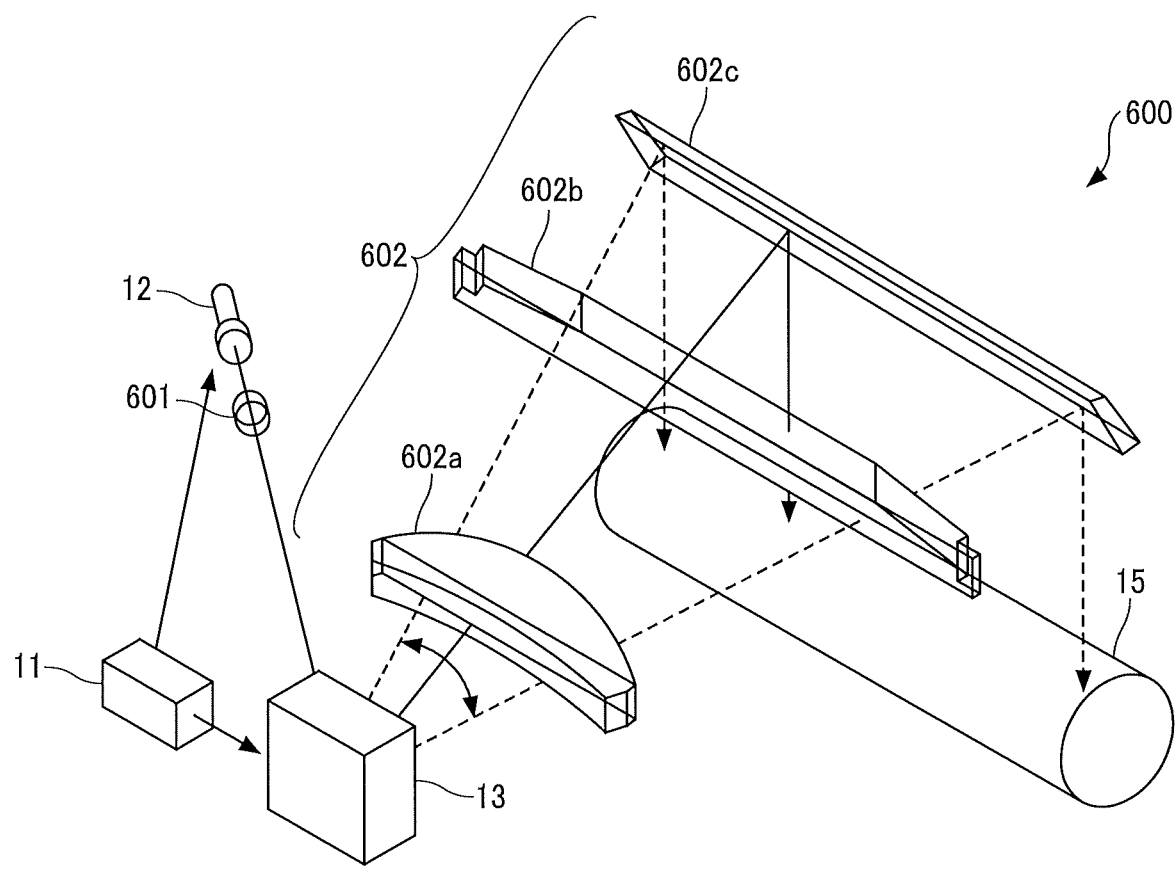
FIG. 8 is a schematic view of an example of the optical writing device.

Next, an optical writing device to which the movable device 13 according to the embodiment is applied is described in detail referring to FIGS. 7 and 8.

FIG. 7 illustrates an example of an image forming apparatus equipped with an optical writing device 600. FIG. 8 is a schematic view of an example of the optical writing device 600.

As illustrated in FIG. 7, the optical writing device 600 is used as a component of an image forming apparatus typified by a laser printer 650, for example, having a printer function using laser beams. In the image forming apparatus, the optical writing device 600 performs optical scanning on a photoconductor drum, which is the target surface 15, by using one or more laser beams, thereby performing optical writing on the photoconductor drum.

As illustrated in FIG. 8, in the optical writing device 600, a laser beam from the light-source device 12 such as a laser element passes through an image forming optical system 601 such as a collimator lens and is then deflected uniaxially or biaxially by the movable device 13 having the reflecting surface 14. The laser beam deflected by the movable device 13 then passes through a scanning optical system 602 including a first lens 602a, a second lens 602b, and a reflecting mirror 602c, and is emitted onto the target surface 15 (for example, a photoconductor drum or photosensitive paper), and thereby optical writing is performed. The scanning optical system 602 forms a laser beam in the form of a spot on the target surface 15. The light-source device 12 and the movable device 13 having the reflecting surface 14 are driven based on the control of the control device 11.

As described above, the optical writing device 600 can be used as a component of the image forming apparatus having a printer function using laser beams. Moreover, by employing another scanning optical system to perform scanning in a biaxial manner in addition to the uniaxial manner, the optical writing device 600 can also be used as a component of an image forming apparatus such as a laser label apparatus that deflects laser beams to perform optical scanning on thermal media and print letters by heating.

The movable device 13 having the reflecting surface 14 to be applied to the optical writing device is advantageous in saving power of the optical writing device because power consumption for driving the movable device 13 is less than that for driving a rotational polygon mirror or the like. The movable device 13 makes a smaller wind noise when the mirror substrate oscillates compared with a rotational polygon mirror, and thus is advantageous in achieving low noise of the optical writing device. The optical writing device requires much smaller installation space than the installation space of a rotational polygon mirror, and the amount of heat generated by the movable device 13 is small. Accordingly, downsizing is easily achieved, and thus the optical writing device is advantageous in downsizing the image forming apparatus.

Figure 9:
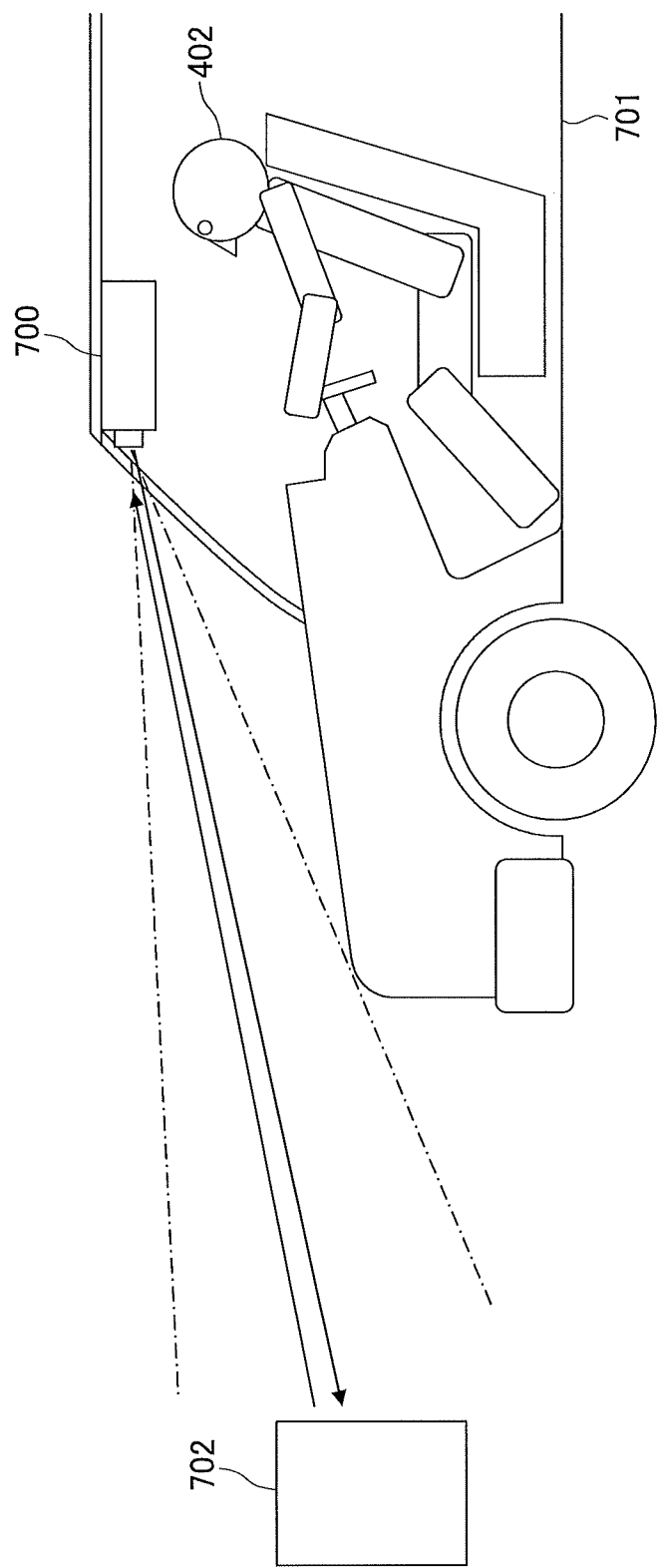
FIG. 9 is a schematic view of another example of a vehicle equipped with a laser imaging detection and ranging (LiDAR) device.
Figure 10:
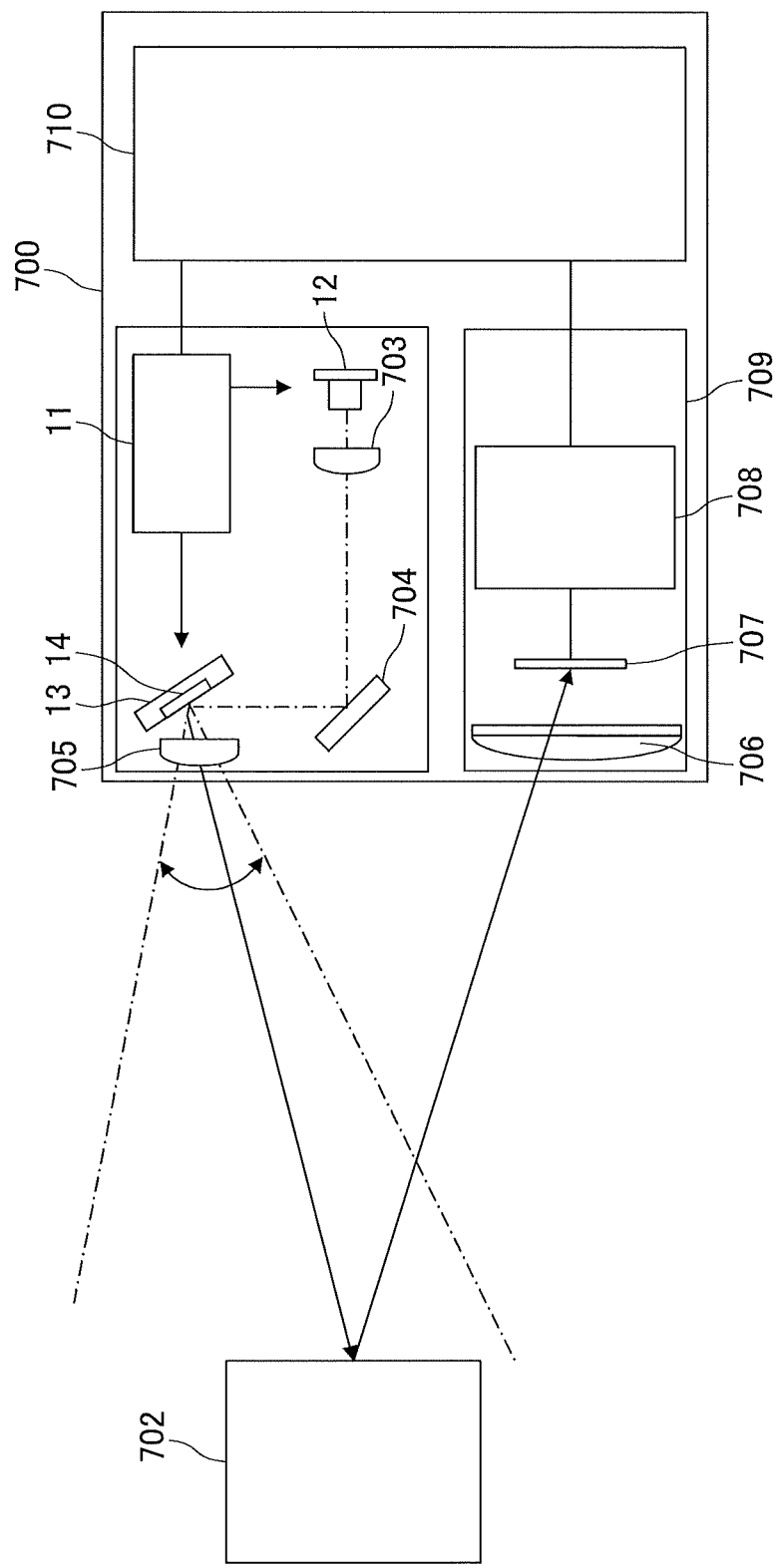
FIG. 10 is a schematic view of an example of the LiDAR device.

Next, a distance measurement device to which the movable device according to the embodiment is applied is described in detail referring to FIGS. 9 and 10.

FIG. 9 is a schematic view of a vehicle equipped with a laser imaging detection and ranging (LiDAR) device as an example of a distance measurement device. FIG. 10 is a schematic view of an example of the LiDAR device.

The distance measurement device is a device that measures a distance in a target direction, and is, for example, a LiDAR device.

As illustrated in FIG. 9, for example, a LiDAR device 700 is mounted on a vehicle 701. The LiDAR device 700 performs optical scanning in a target direction and receives the light reflected from an object 702 that exists in the target direction, to measure the distance from the object 702.

As illustrated in FIG. 10, the laser beams emitted from a light-source device 12 pass through an incidence optical system, and then are caused to perform scanning uniaxially or biaxially using the movable device 13 having the reflecting surface 14. The incidence optical system includes a collimator lens 703 that serves as an optical system that collimates divergent beams into approximately parallel beams, and a planar mirror 704. The parallel beams are emitted to the object 702 ahead of the device, as passing through, for example, a projection lens 705 that serves as a projection optical system. The driving of the light-source device 12 and the movable device 13 is controlled by the control device 11. The light reflected by the object 702 is detected by a photodetector 709. More specifically, the reflected light passes through, for example, a condenser lens 706 that serves as an incident-light receiving and detecting optical system, and is received by an image sensor 707. Then, the image sensor 707 outputs a detected signal to a signal processing circuit 708. The signal processing circuit 708 performs predetermined processing on the received detected signal, such as binarization or noise processing, and outputs the result to a distance measuring circuit 710.

The distance measuring circuit 710 determines whether the object 702 is present based on the time difference between the timing at which the light-source device 12 emits laser beams and the timing at which the photodetector 709 receives the laser beams or the phase difference per pixel of the image sensor 707 that have received the laser beams. Moreover, the distance measuring circuit 710 calculates distance information indicating the distance from the object 702.

The movable device 13 having the reflecting surface 14 is less likely broken and is compact compared with a polygon mirror, and thus, a highly durable and compact LiDAR device can be provided. Such a LiDAR device is attached to, for example, a vehicle, an aircraft, a ship, a robot, or the like, and can perform optical scanning within a predetermined range to determine whether an obstacle is present or to measure the distance from the obstacle. The installation position of the LiDAR device 700 is not limited to an upper and front portion of the vehicle 701, and the LiDAR device 700 may be mounted at a side surface or a rear portion of the vehicle 701.

The LiDAR device 700 is described as an example of the distance measurement device. However, no limitation is intended thereby. The distance measurement device may be any device that performs optical scanning by controlling the movable device 13 having the reflecting surface 14, using the control device 11, and that receives the reflected light using a photodetector to measure the distance from the object 702.

For example, the present disclosure is also applicable to a biometric authentication apparatus, a security sensor, or a component of a three-dimensional scanner, for example. The biometric authentication apparatus performs optical scanning on a hand or face to obtain distance information, calculates object information such as the shape of the object based on the distance information, and refers to records to recognize the object. The security sensor performs optical scanning in a target range to recognize an incoming object. The three-dimensional scanner performs optical scanning to obtain distance information, calculates object information such as the shape of the object based on the distance information to recognize the object, and outputs the object information in the form of three-dimensional data.

Figure 11:
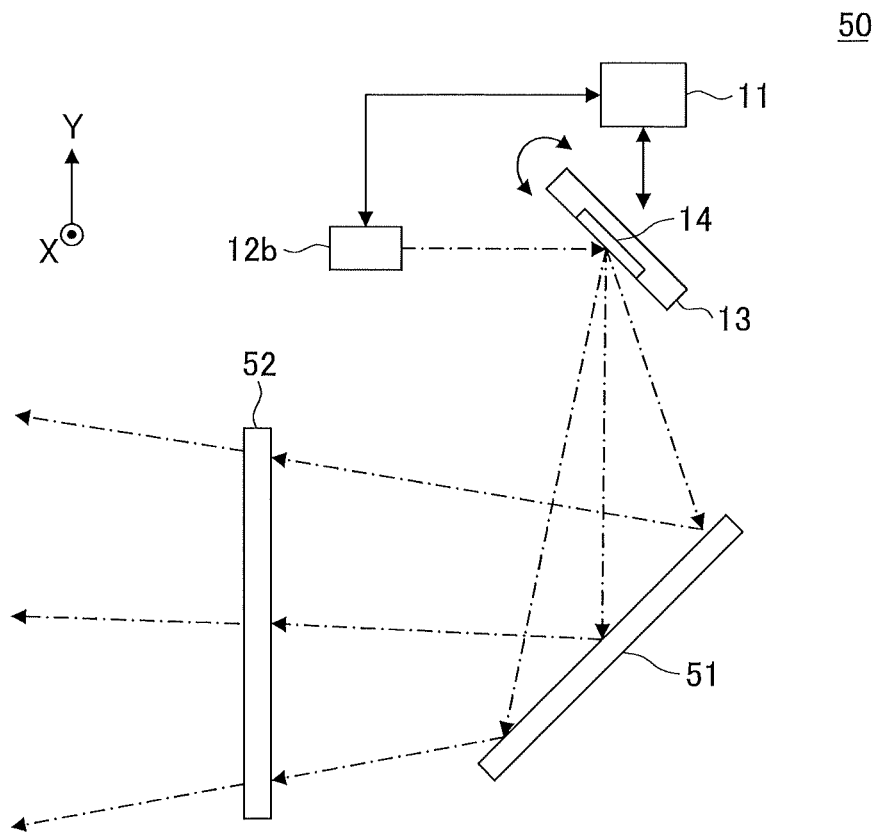
FIG. 11 is a schematic view of an example of a configuration of a laser headlamp.

Next, a laser headlamp 50 in which the movable device of the embodiment is applied to a headlight of a vehicle is described referring to FIG. 11. FIG. 11 is a schematic view of an example of a configuration of the laser headlamp 50.

The laser headlamp 50 includes a control device 11, a light-source device 12b, a movable device 13 including a reflecting surface 14, a mirror 51, and a transparent plate 52.

The light-source device 12b is a light source that emits blue laser beams. The laser beams emitted from the light-source device 12b are incident on the movable device 13 and are reflected by the reflecting surface 14. The movable device 13 moves the reflecting surface 14 in the XY-direction based on the signal from the control device 11, and performs two-dimensional scanning using blue laser beams emitted from the light-source device 12b in the XY-direction.

The scanning light of the movable device 13 is reflected by the mirror 51, and is incident on the transparent plate 52. The transparent plate 52 is coated with a yellow phosphor on the front surface or the back surface. The blue laser beams that are reflected by the mirror 51 are converted into white light whose color is within the range of the statutory color for a headlight as passing through the yellow phosphor (fluorescent material) of the transparent plate 52. Thereby, the front of the vehicle is illuminated with white light from the transparent plate 52.

The scanning light of the movable device 13 scatters in a predetermined manner as passing through the fluorescent material of the transparent plate 52. Accordingly, glare is attenuated at an illuminated target in the area ahead of the vehicle.

When the movable device 13 is applied to a headlight of a vehicle, the color of light beams from the light-source device 12b and the color of the phosphor are not limited to blue and yellow, respectively. For example, the light-source device 12b may emit near-ultraviolet light, and the transparent plate 52 may be coated with homogenized mixture of a plurality of kinds of fluorescent materials of red-green-blue (RGB) trichromatic colors. In this case as well, the light passing through the transparent plate 52 can be converted into white light, and the front of the vehicle can be illuminated with white light.

Head-Mounted Display

Figure 12:
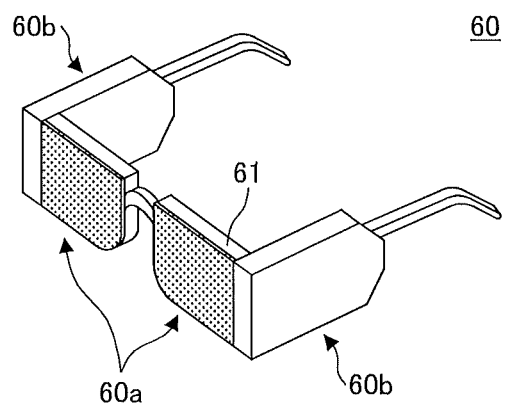
FIG. 12 is a schematic perspective view of an example of a configuration of a head-mounted display (HMD)
Figure 13:
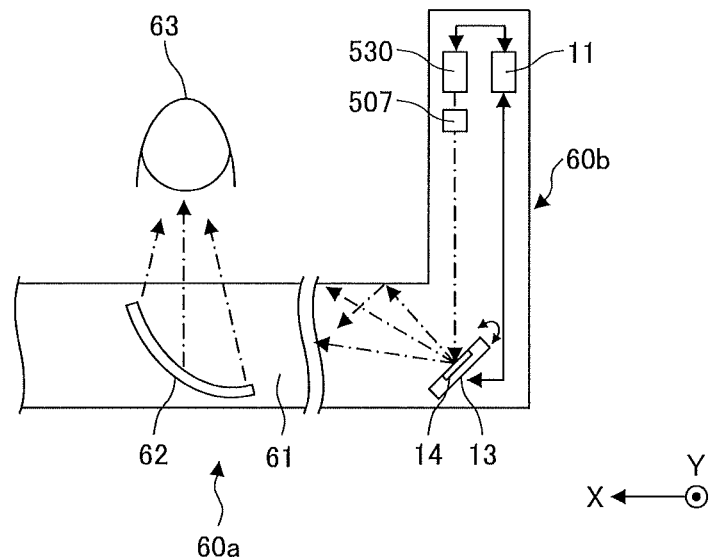
FIG. 13 illustrates an example of a part of a configuration of the HMD.

Next, a head-mounted display (HMD) 60 to which the movable device 13 according to the embodiment is applied is described referring to FIGS. 12 and 13. Note that the HMD 60 is a head-mounted display that can be mounted on a human head, and can be shaped like, for example, glasses.

FIG. 12 is a perspective view of the appearance of the HMD 60. In FIG. 12, the HMD 60 includes a pair of a front 60a and a temple 60b provided substantially symmetrically on each of the left and right. The front 60a can include, for example, a light guide plate 61. An optical system, a control device, and the like, can be incorporated in the temple 60b.

FIG. 13 illustrates a partial configuration of the HMD 60. Although the configuration for the left eye is illustrated in FIG. 13, the HMD 60 has a configuration similar to that for the right eye.

The HMD 60 includes a control device 11, a light source unit 530, a light-intensity adjuster 507, a movable device 13 including a reflecting surface 14, a light guide plate 61, and a half mirror 62.

The light source unit 530 includes, as described above, the laser-beam sources 501R, 501G, and 501B, the collimator lenses 502, 503, and 504, and the dichroic mirrors 505 and 506, and these elements are combined as a single unit in the optical housing. In the light source unit 530, the laser beams of the RGB colors that are emitted from the laser-beam sources 501R, 501G, and 501B are combined by the two dichroic mirrors 505 and 506. The light source unit 530 emits combined parallel light.

The light intensity of the combined laser beams from the light source unit 530 is adjusted by the light-intensity adjuster 507, and then the light is incident on the movable device 13. The movable device 13 moves the reflecting surface 14 in the XY-direction based on the signal from the control device 11, and performs two-dimensional scanning with the light emitted from the light source unit 530. The driving of the movable device 13 is controlled in synchronization with the light emission timings of the laser-beam sources 501R, 501G, and 501B, and a color image is formed with the scanning light.

The scanning light of the movable device 13 is incident on the light guide plate 61. The light guide plate 61 guides the scanning light to the half mirror 62 while reflecting the scanning light on the inner wall surface. The light guide plate 61 is formed of a material such as a resin having transparency at the wavelength of the scanning light.

The half mirror 62 reflects the light from the light guide plate 61 to the back side of the HMD 60, and emits the light in the direction of the eyes of a wearer 63 of the HMD 60. The half mirror 62 has, for example, a free-form surface shape. The image of the scanning light is reflected by the half mirror 62, and then is formed on the retina of the wearer 63. The image of the scanning light is formed on the retina of the wearer 63 due to the reflection at the half mirror 62 and the effect of the crystalline lenses of eyeballs. Moreover, due to the reflection at the half mirror 62, the spatial distortion of the image is corrected. The wearer 63 can observe an image formed by the light of scanning in the XY direction.

The wearer 63 observes an image of external light superimposed on the image of the scanning light because of the half mirror 62. Alternatively, a mirror may be provided instead of the half mirror 62 so that external light is blocked out and the wearer 63 observes only the image of the scanning light.

Figure 14:
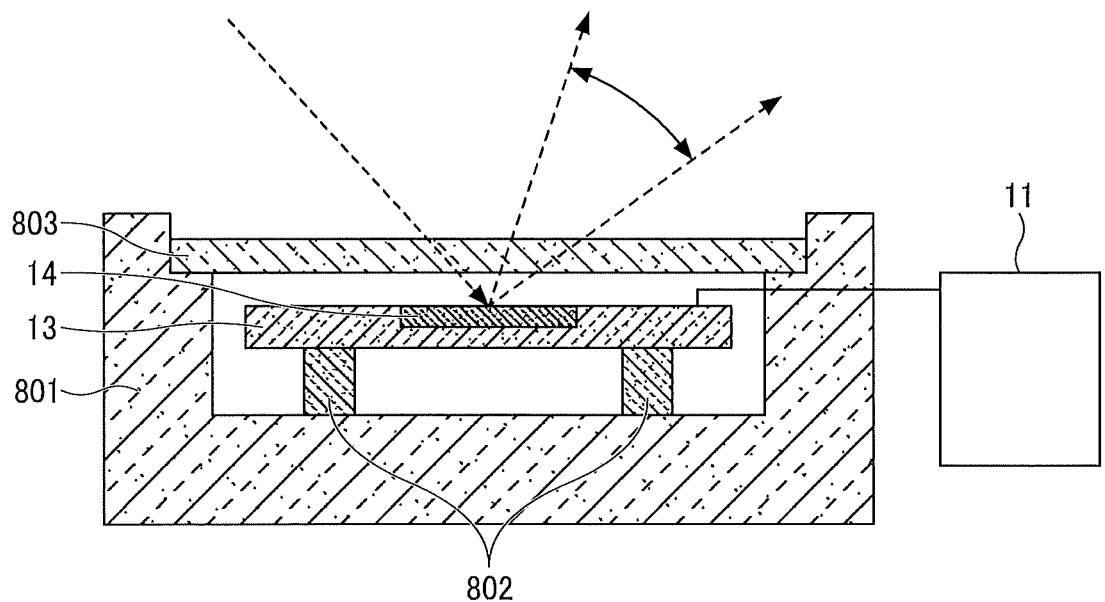
FIG. 14 is a schematic view of an example of a packaged movable device.

Next, packaging of the movable device 13 according to the embodiment is described referring to FIG. 14.

FIG. 14 is a schematic view of an example a packaged movable device 13.

As illustrated in FIG. 14, the movable device 13 is mounted on a mounting member 802 inside a package member 801. The package member 801 is partly covered with and sealed by a transmissive member 803 so that the movable device 13 is packaged. The package contains inert gas such as nitrogen and is sealed. This configuration can prevent the deterioration of the movable device 13 due to oxidation, and increase the durability against changes in environment such as temperature.

The details of the movable device that is used for the above-described optical deflection system, optical scanning system, image projection apparatus, optical writing device, and distance measurement device, and the details of the control by the control device according to the embodiment are described referring to FIGS. 15 to 18C.

Figure 15:
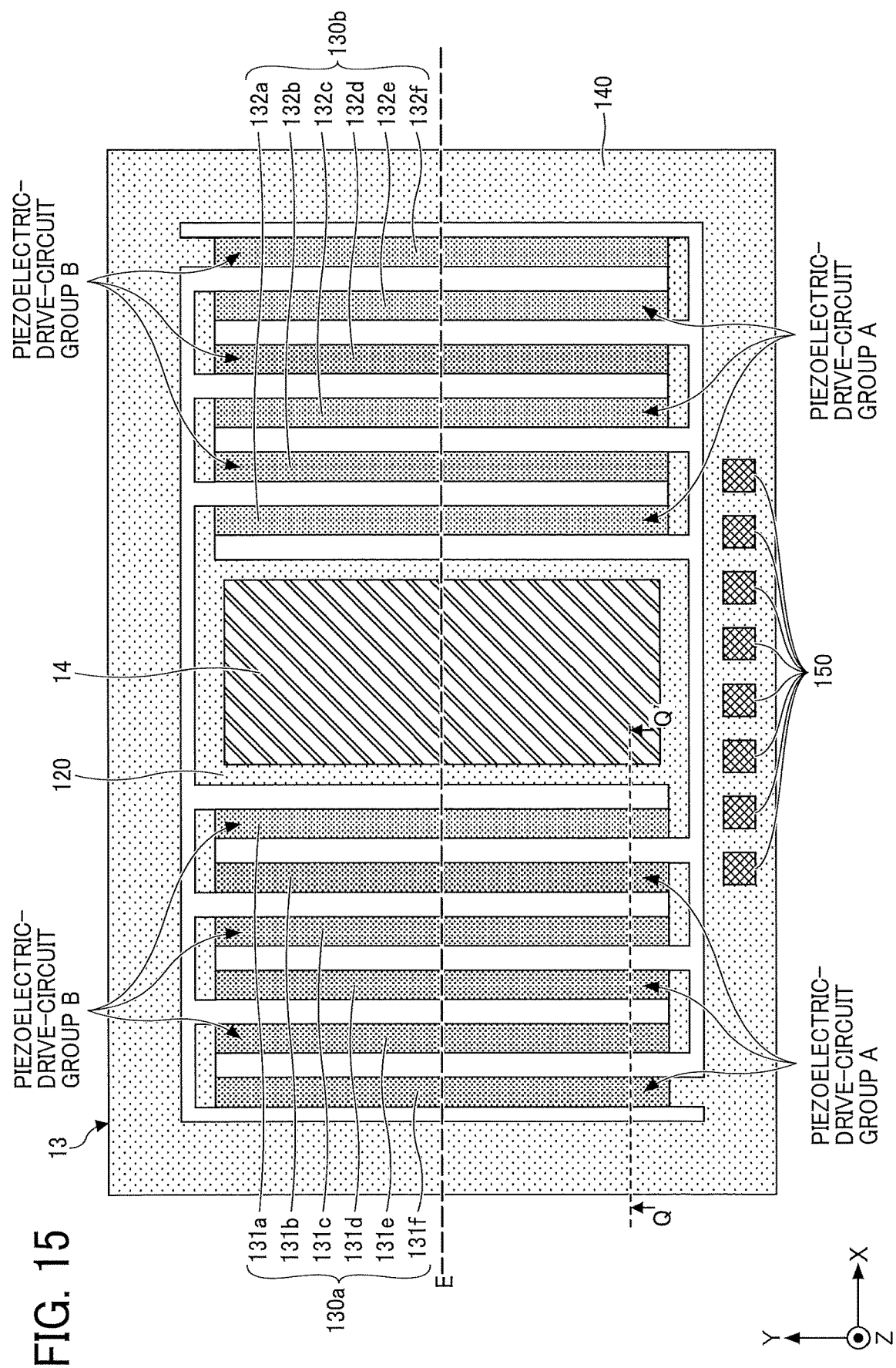
FIG. 15 is a plan view of an example of the movable device when viewed in the +Z direction.
Figure 16:
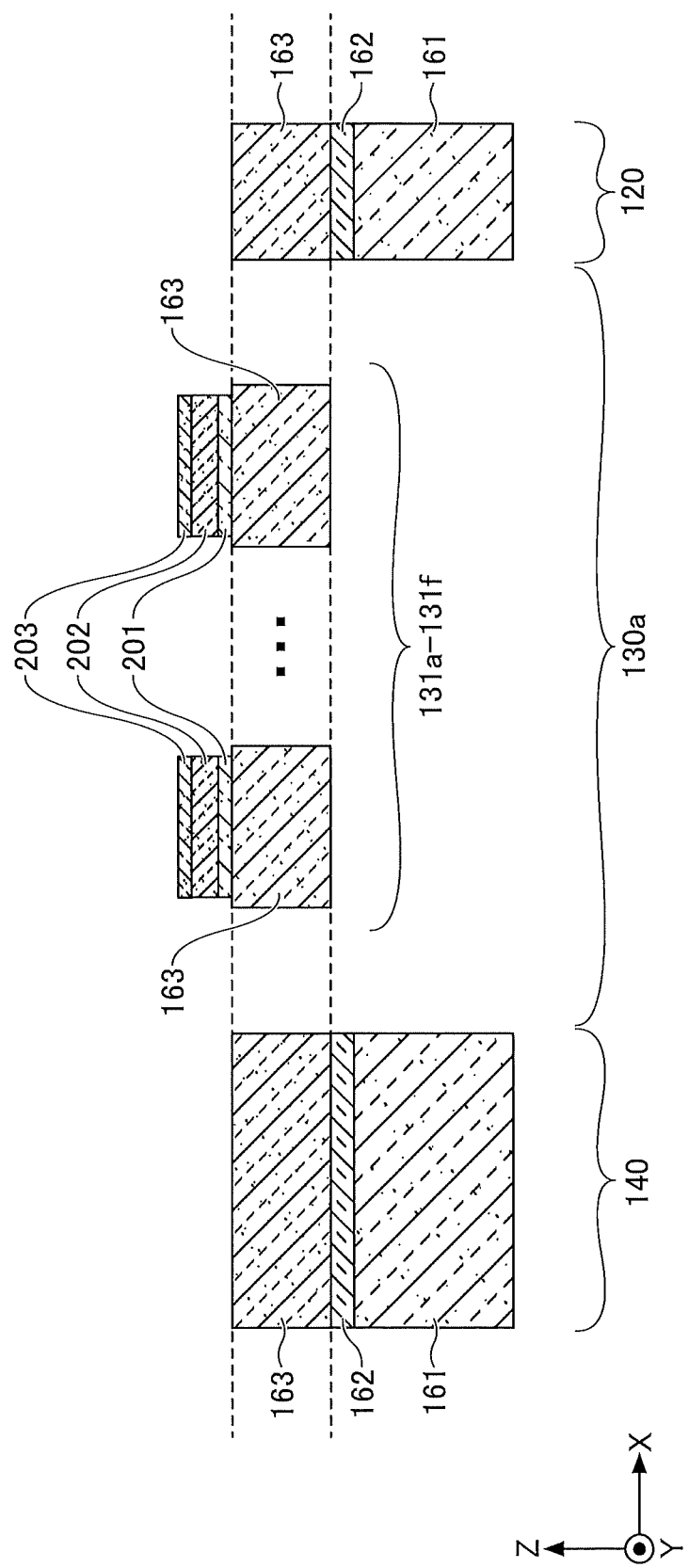
FIG. 16 is a cross-sectional view of the movable device taken along line Q-Q' in FIG. 15.

The movable device is described in detail first referring to FIGS. 15 and 16.

FIG. 15 is a plan view of a movable device that is doubly supported (both-end support beams) and can uniaxially deflect light. FIG. 16 is a cross-sectional view taken along line Q-Q' in FIG. 15.

As illustrated in FIG. 15, the movable device 13 includes a reflecting surface 14 that reflects incident light, a movable part 120 provided with the reflecting surface 14, drive beams 130a and 130b that are coupled to the movable part 120 and that drive the reflecting surface 14 and the movable part 120 around the E-axis parallel to the X-axis, a supporting section 140 that supports the drive beams 130a and 130b, and an electrode connection portion 150 that is electrically connected to the drive beams 130a and 130b and a control device.

The movable device 13 includes, for example, one silicon on insulator (SOI) substrate that is formed by any appropriate treatment method, such as etching. On the formed SOI substrate, the reflecting surface 14, piezoelectric drive circuits 131a to 131f, and 132a to 132f, and the electrode connection portion 150 are formed, which constitutes an integral structure of the above-described components. The above-described multiple components may be formed after the SOI substrate is molded, or may be formed while the SOI substrate is being molded.

The SOI substrate is a substrate in which, on a first silicon layer formed of single crystal silicon (Si), a silicon oxide layer 162 is formed, and on the silicon oxide layer 162, a second silicon layer formed of single crystal silicon is further formed. Hereinafter, the first silicon layer is referred to as silicon support layer 161, and the second silicon layer is referred to as silicon active layer 163.

The silicon active layer 163 has a smaller thickness in the Z-axis direction than the thickness in the X-axis direction or the Y-axis direction. With such a configuration, any member made of the silicon active layer 163 serves as an elastic member having elasticity.

The SOI substrate does not have to be planar, and may have, for example, a curvature. As long as the substrate can be integrally processed by etching or the like and can be partially elastic, the member used for forming the movable device 13 is not limited to the SOI substrate.

The movable part 120 includes, for example, a base body and the reflecting surface 14 formed on the +Z surface of the base body. The base body includes, for example, the silicon active layer 163. The reflecting surface 14 includes a metal thin film containing, for example, aluminum (Al), gold (Au), or silver (Ag). The movable part 120 may have a reinforcing rib on the −Z surface of the base body for the reflection surface 14. Such a rib includes, for example, the silicon support layer 161 and the silicon oxide layer 162, serving to prevent the distortion of the reflecting surface 14 due to the motion.

The drive beams 130a and 130b include, for example, a plurality of piezoelectric drive circuits 131a to 131f and 132a to 132f that are joined so as to turn. An end of each of the drive beams 130a and 130b is coupled to an outer peripheral portion of the movable part 120, and the other end of each of the drive beams 130a and 130b is coupled to an inner peripheral portion of the supporting section 140. In this case, a position to couple the drive beam 130a with the movable part 120 and another position to couple the drive beam 130b with the movable part 120 are symmetric with respect to the center point of the reflecting surface 14. In addition, a position to couple the drive beam 130a with the supporting section 140 and another position to couple the drive beam 130b with the supporting section 140 are symmetric with respect to the center point of the reflecting surface 14.

As illustrated in FIG. 16, the drive beams 130a and 130b each include a lower electrode 201, a piezoelectric portion 202, and an upper electrode 203 that are formed in that order on the +Z surface of the silicon active layer 163 that serves as an elastic member. Each of the upper electrode 203 and the lower electrode 201 is made of, for example, gold (Au) or platinum (Pt). For example, the piezoelectric portion 202 is made of lead zirconate titanate (PZT), which is a piezoelectric material.

Referring back to FIG. 15, the supporting section 140 is, for example, a rectangular support body including the silicon support layer 161, the silicon oxide layer 162, and the silicon active layer 163, and surrounding the movable part 120 and the drive beams 130a and 130b.

The electrode connection portion 150 is, for example, formed on the +Z surface of the supporting section 140 and is electrically connected to the upper electrode 203 and the lower electrode 201 of each of the piezoelectric drive circuits 131a and 131f, and the control device 11 via electrode wiring of aluminum (Al) or the like. The upper electrode 203 or the lower electrode 201 may be directly connected to the electrode connection portion 150. Alternatively, the upper electrode 203 and the lower electrode 201 may be connected to each other, to be indirectly connected to the electrode connection portion 150.

Although this embodiment has illustrated an example in which the piezoelectric portion 202 is formed on a surface (+Z surface) of the silicon active layer 163 serving as the elastic member, the piezoelectric portion 202 may be formed on another surface (for example, −Z surface) of the elastic member, or on both the surface and the other surface of the elastic member.

The shapes of the components are not limited to the shapes in the embodiment as long as the movable part 120 can be driven around the E-axis. An insulating layer made of a silicon oxide film may be formed on the +Z surface of the upper electrode 203 of each of the drive beams 130a and 130b.

In this case, electrode wiring is provided on the insulating layer, and the insulating layer is partially removed as an opening or is not formed at a connection spot where the upper electrode 203 or the lower electrode 201 and the electrode wiring are connected, so that the drive beams 130a and 130b, and the electrode wiring can be designed with a higher degree of freedom, and furthermore, a short circuit as a result of contact between electrodes can be prevented. The silicon oxide film also serves as an anti-reflection member.

Next, the control by the control device that drives the drive beams of the movable device is described in detail.

The piezoelectric portions 202 of the drive beams 130a and 130b, when a positive or negative voltage in the polarization direction is applied thereto, are deformed (for example, expanded or contracted) in proportion to the potential of the applied voltage, and exhibit inverse piezoelectric effect. The drive beams 130a and 130b move the movable part 120 by using the inverse piezoelectric effect.

In this case, the angle defined by the reflecting surface 14 of the movable part 120 with respect to the XY plane when the reflecting surface 14 is inclined to the +Z direction or −Z direction with respect to the XY plane is referred to as deflection angle. In particular, the +Z direction represents a positive deflection angle and the −Z direction represents a negative deflection angle.

The control by the control device that drives the drive beams is described referring to FIGS. 17A to 17D.

FIGS. 17A to 17D are schematic views schematically illustrating driving of the drive beam 130b of the movable device 13. Parts indicated by dotted lines are the movable part 120 and other parts. The right side in a view facing the drawing is the +X direction, the upper side in a view facing the drawing is the +Y direction, and the near side in a view facing the drawing is +Z direction.

Figure 17A:
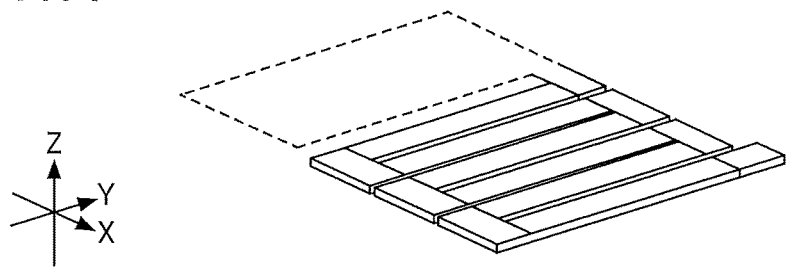
FIGS. 17A to 17D are schematic views when drive beams of the movable device are deformed.

As illustrated in FIG. 17A, the deflection angle by the drive beam 130b is zero when the drive voltage is not applied to the drive beam 130b.

Figure 17B:
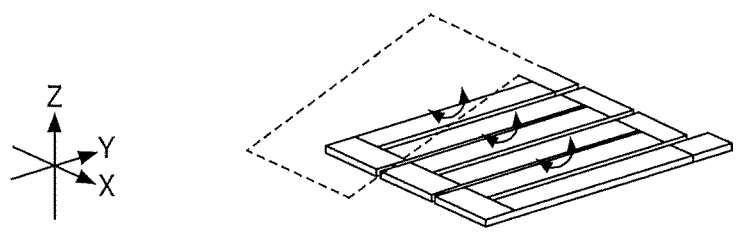

Among the plurality of piezoelectric drive circuits 131a to 131f of the drive beam 130a, the piezoelectric drive circuits 131b, 131d, and 131f are categorized as a piezoelectric-drive-circuit group A, each of which is an even-numbered piezoelectric drive circuit counted from the piezoelectric drive circuit (131a) that is closest to the movable part 120. Among the plurality of piezoelectric drive circuits 132a to 132f of the drive beam 130b, the piezoelectric drive circuits 132a, 132c, and 132e are categorized as a piezoelectric-drive-circuit group A, each of which is an odd-numbered piezoelectric drive portion counted from the piezoelectric drive circuit (132a) that is closest to the movable part 120. As illustrated in FIG. 17B, the piezoelectric drive circuits of the piezoelectric-drive-circuit group A having received the drive voltage applied in parallel bend and deform in the identical direction, so that the movable part 120 rotates in the −Z direction around the E-axis.

Among the plurality of piezoelectric drive circuits 131a to 131f of the drive beam 130a, the piezoelectric drive circuits 131a, 131c, and 131e are categorized as a piezoelectric-drive-circuit group B, each of which is an odd-numbered piezoelectric drive circuit counted from the piezoelectric drive circuit (131a) that is closest to the movable part 120. Among the plurality of piezoelectric drive circuits 132a to 132f of the drive beam 130b, the piezoelectric drive circuits 132b, 132d, and 132f are categorized as a piezoelectric-drive-circuit group B, each of which is an even-numbered piezoelectric drive circuit counted from the piezoelectric drive circuit (132a) that is closest to the movable part 120. As illustrated in FIG. 17D, the piezoelectric drive circuits of the piezoelectric-drive-circuit group B having received the drive voltage applied in parallel bend and deform in the identical direction, so that the movable part 120 rotates in the +Z direction around the E-axis.

As illustrated in FIGS. 17B and 17D, in the drive beam 130a or 130b, the plurality of piezoelectric portions 202 of the piezoelectric-drive-circuit group A or the plurality of piezoelectric portions 202 of the piezoelectric-drive-circuit group B concurrently bend and deform. Thus, the movable amount due to bending and deformation is accumulated, thereby increasing the deflection angle of the movable part 120 around the E-axis.

For example, as illustrated in FIG. 15, the drive beams 130a and 130b are coupled to the movable part 120 point-symmetrically with respect to the center point of the movable part 120. Thus, when the drive voltage is applied to the piezoelectric-drive-circuit group A, a drive force of driving in the +Z direction is generated in the drive beam 130a at the coupling portion of the movable part 120 and the drive beam 130a; and a drive force of driving in the −Z direction is generated in the drive beam 130b at the coupling portion of the movable part 120 and the drive beam 130b. Thus, the movable amount is accumulated and hence the deflection angle of the movable part 120 around the E-axis can be increased.

Figure 17C:
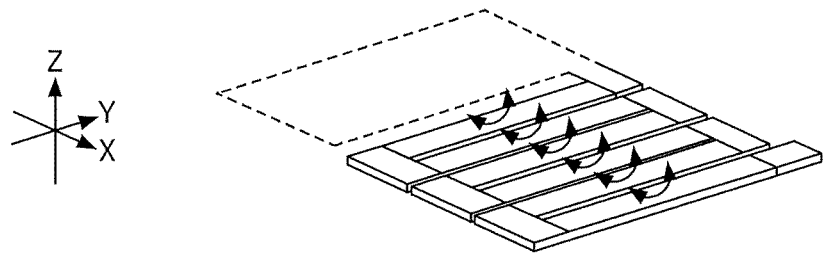
Figure 17D:
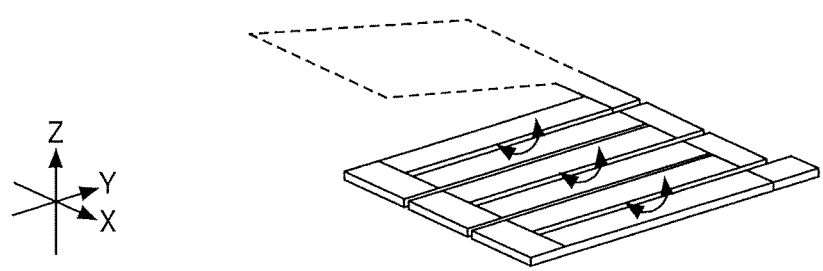

As illustrated in FIG. 17C, the deflection angle is zero when the movable amount of the movable part 120 by the piezoelectric-drive-circuit group A due to voltage application is in balance with the movable amount of the movable part 120 by the piezoelectric-drive-circuit group B due to voltage application.

The drive voltage is applied to the piezoelectric drive circuits to continuously repeat the situations in FIGS. 17B to 17D. Thus, the movable part 120 can be driven around the E-axis.

The drive voltages that are applied to the drive beams are controlled by the control device.

The drive voltage that is applied to the piezoelectric-drive-circuit group A (hereinafter, drive voltage A) and the drive voltage that is applied to the piezoelectric-drive-circuit group B (hereinafter, drive voltage B) are described referring to FIGS. 18A to 18C.

Figure 18A:
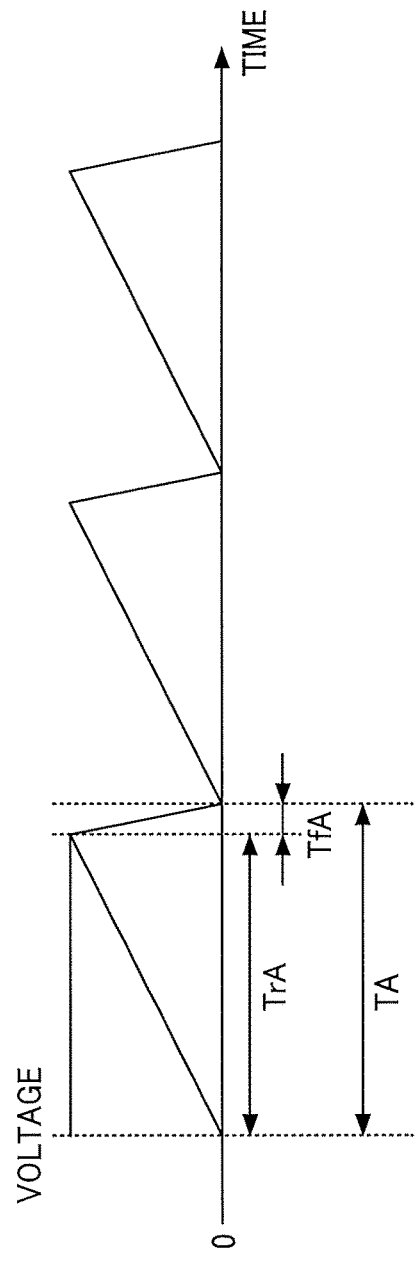
FIG. 18A illustrates an example of the waveform of a drive voltage A that is applied to a piezoelectric-drive-circuit group A of the movable device.

FIG. 18A is an example of the waveform of the drive voltage A that is applied to the piezoelectric-drive-circuit group A of the movable device 13. FIG. 18B is an example of the waveform of the drive voltage B that is applied to the piezoelectric-drive-circuit group B of the movable device. FIG. 18C is a view in which the waveform of the drive voltage A and the waveform of the drive voltage B are superimposed on each other.

As illustrated in FIG. 18A, the drive voltage A that is applied to the piezoelectric-drive-circuit group A is in a sawtooth waveform and has a frequency of, for example, 60 Hz. The waveform of the drive voltage A has a preset ratio of TrA:TfA=9:1 where TrA is a time width of a rising duration in which the voltage value increases from a minimum value to a maximum value and TfA is a time width of a falling duration in which the voltage value decreases from the maximum value to a next minimum value. In this case, the ratio of TrA to one cycle is referred to as a symmetry of the drive voltage A.

Figure 18B:
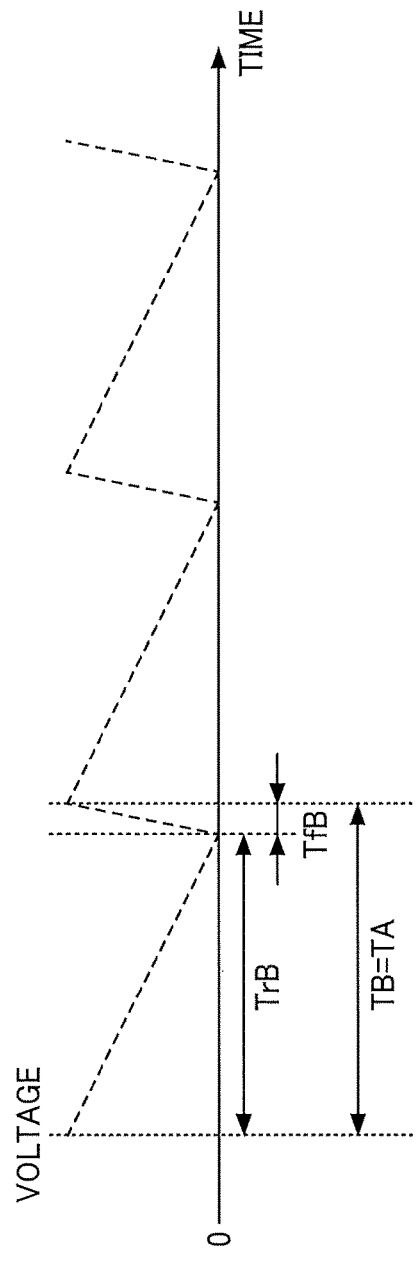
FIG. 18B illustrates an example of the waveform of a drive voltage B that is applied to a piezoelectric-drive-circuit group B of the movable device.
Figure 18C:
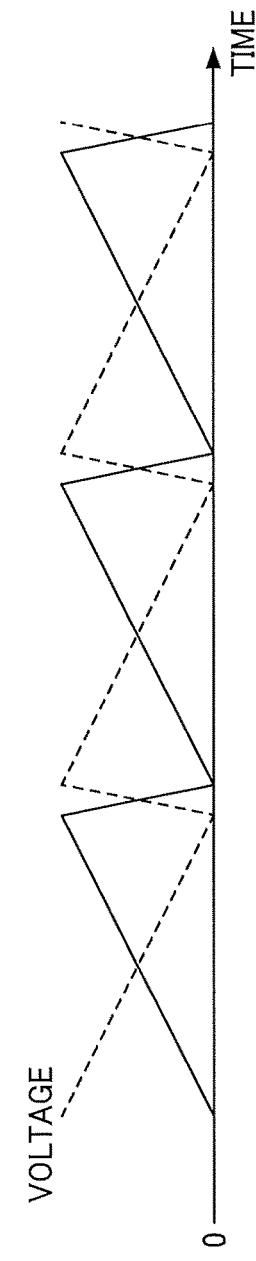
FIG. 18C illustrates superimposed waveforms of the waveform of the drive voltage A in FIG. 18A and the waveform of the drive voltage B in FIG. 18B.

As illustrated in FIG. 18B, the drive voltage B that is applied to the piezoelectric-drive-circuit group B is in a sawtooth waveform and has a frequency of, for example, 60

Hz. The waveform of the drive voltage B has a preset ratio of TfB:TrB=9:1 where TrB is a time width of a rising duration in which the voltage value increases from a minimum value to a maximum value and TfB is a time width of a falling duration in which the voltage value decreases from the maximum value to a next minimum value. In this configuration, the ratio of TfB to one cycle is referred to as a symmetry of the drive voltage B. As illustrated in FIG. 18C, for example, a cycle TA of the waveform of the drive voltage A and a cycle TB of the waveform of the drive voltage B are set to be equal to each other.

The sawtooth waveforms of the drive voltage A and the drive voltage B are generated by the superposition of sine waves. In the embodiment, the drive voltages in the sawtooth waveforms are used for the drive voltages A and B; however, no limitation is intended thereby. The waveforms can be changed in accordance with the device characteristics of the movable device. The device characteristics include, for example, a drive voltage with a waveform in which a vertex of a sawtooth waveform is rounded, and a drive voltage with a waveform in which a straight line region of a sawtooth waveform is curved.

First Embodiment

Figure 19A:
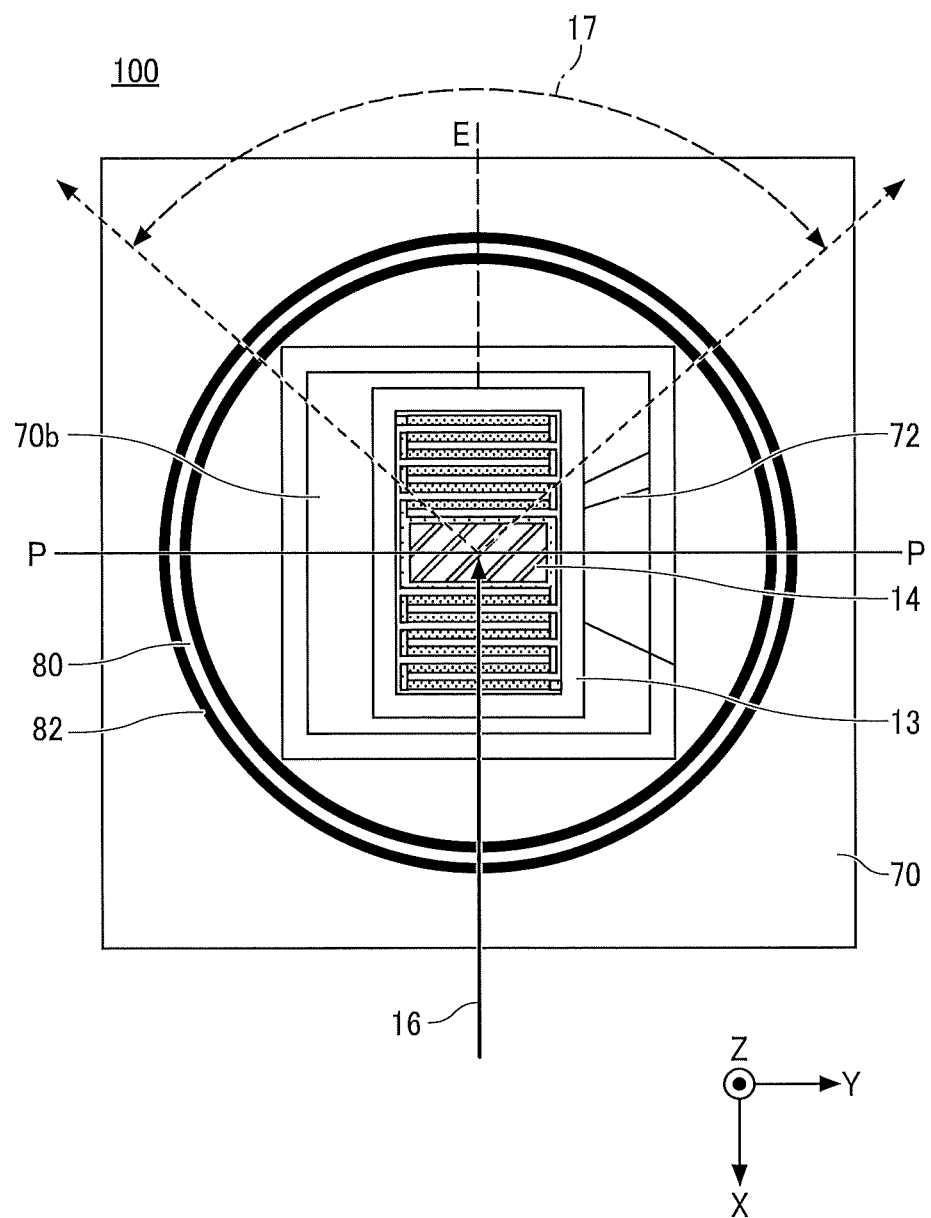
FIGS. 19A and 19B each illustrate an example of a configuration of a light deflection device according to a first embodiment, FIG. 19A being a plan view, FIG. 19B being a cross-sectional view taken along line P-P in FIG. 19A.
Figure 19B:
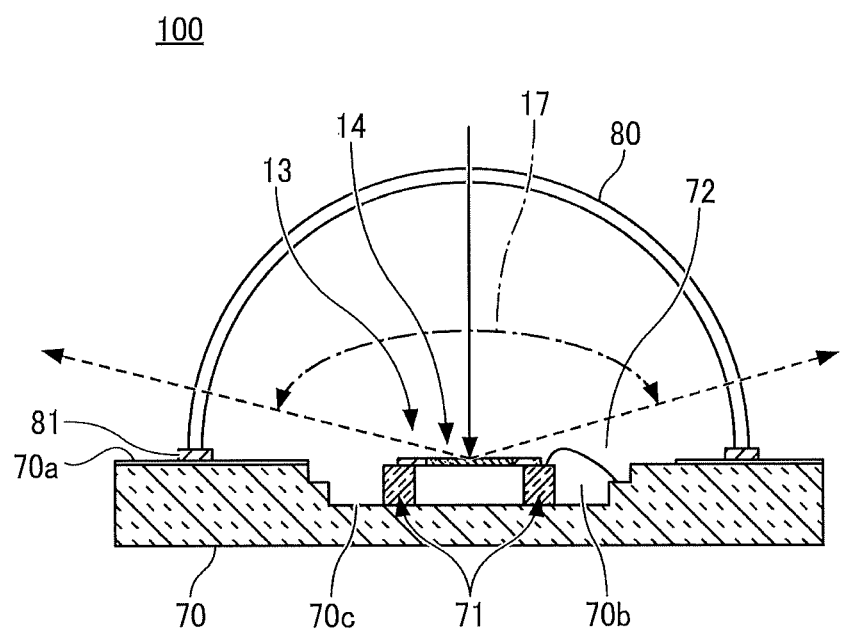
Figure 20:
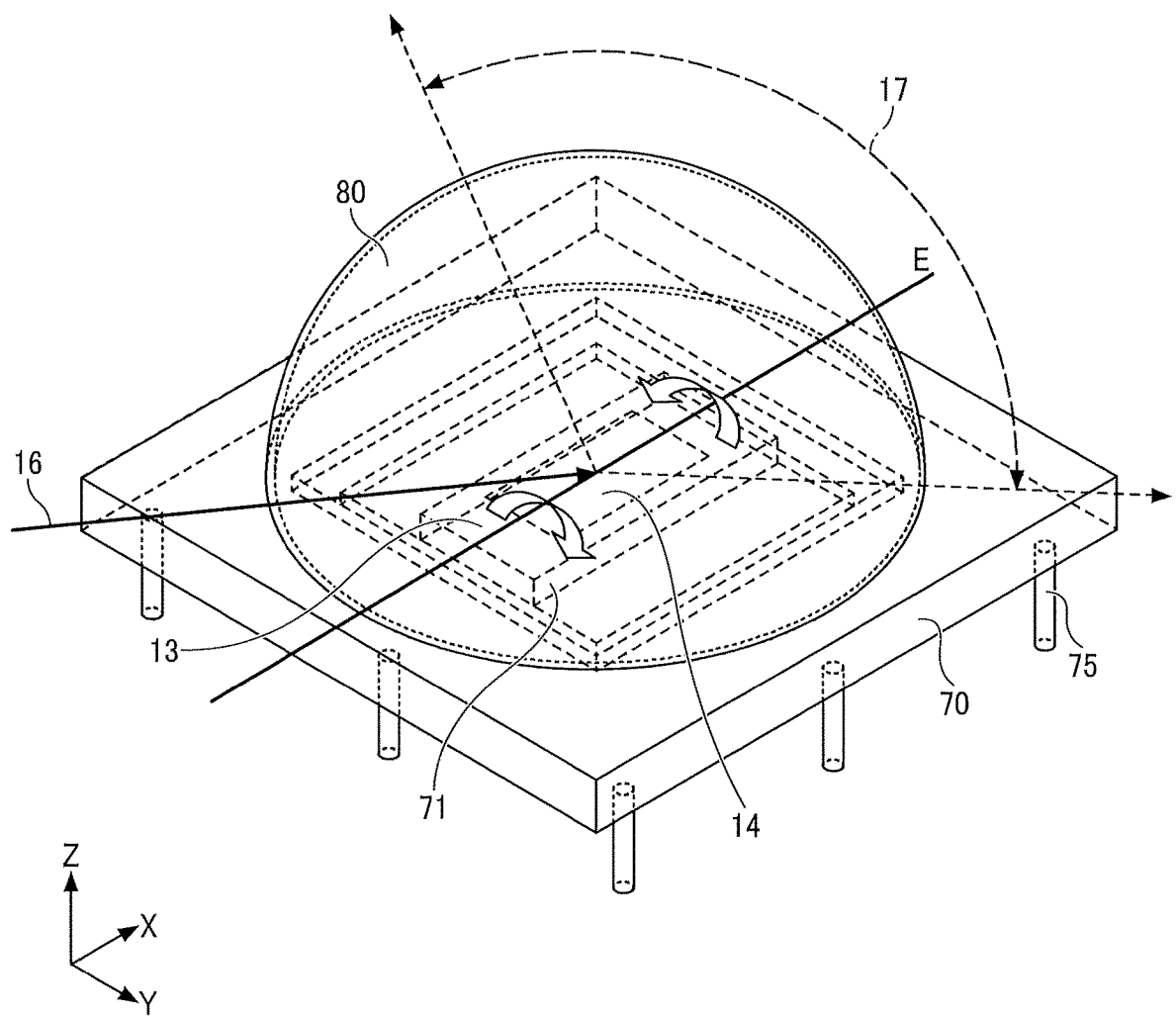
FIG. 20 is a perspective view of an example of the configuration of the light deflection device according to the first embodiment.

Next, a configuration of a light deflection device according to a first embodiment including the above-described movable device 13 is described referring to FIGS. 19A to 20. FIGS. 19A and 19B each illustrate an example of a configuration of the light deflection device according to the embodiment, FIG. 19A being a plan view, FIG. 19B being a cross-sectional view taken along line P-P in FIG. 19A.

As illustrated in FIGS. 19A and 19B, a light deflection device 100 includes a ceramic substrate 70, a spacer member 71, the movable device 13, and a light transmissive member 80.

The ceramic substrate 70 is a substrate formed by stacking a plurality of ceramic layers. The ceramic substrate 70 has a cavity 70b at the +Z surface of the ceramic substrate 70. The ceramic substrate 70 includes a planar portion 70a at the +Z surface of the ceramic substrate 70. The planar portion 70a corresponds to a portion where the cavity 70b is not formed. The ceramic substrate 70 is an example of "substrate", and the cavity 70b is an example of "recess" (depression).

The spacer member 71 is disposed (secured) at a bottom 70c of the cavity 70b. The spacer member 71 is a rectangular-parallelepiped block being long in the X direction, and has a rectangular through hole extending through a center portion of the spacer member 71 in the Z direction.

Specifically, the spacer member 71 may be a spacer member having a rectangular-ring-shaped through opening formed by glass processing or silicon anisotropy etching to extend through the spacer member, or a spacer member molded in a shape with a recessed cross section to have a non-through opening.

A wire 72 is an electric wire for inputting an electric signal to the movable device 13.

The movable device 13 is secured to the +Z surface of the spacer member 71. The height (the length in the Z direction) of the spacer member 71 is adjusted so that the reflection position of light in the Z direction when light is incident on the reflecting surface 14 of the movable part 120 is equal to the height of the planar portion 70a, and so that the movable part 120 of the movable device 13 does not collide with the bottom 70c of the cavity 70b when the movable part 120 is rotated.

The light transmissive member 80 made of a transparent material and including a hollow hemispherical shape is provided above the planar portion 70a of the ceramic substrate 70 and is secured to cover the movable device 13. Since the movable device 13 is covered with the light transmissive member 80, the movable device 13 is not broken by a physical impact, dusts and the like do not adhere to the reflecting surface 14 of the movable device 13, and hence the optical scanning by the movable device 13 is not disturbed. Furthermore, the light transmissive member 80 serves as a window portion which allows light to be incident on the light deflection device 100 and through which the light reflected by the reflecting surface 14 of the movable device 13 is emitted to the outside of the light deflection device 100.

The material of the light transmissive member 80 may be BK7 glass having a thermal expansion coefficient similar to the thermal expansion coefficient of silicon (Si). In addition, antireflection films are provided on both inner and outer surfaces of the light transmissive member 80. Moreover, metal layers are provided at a ring-shaped secured portion of the light transmissive member 80 to be secured onto the planar portion 70a (hereinafter, referred to as secured portion). The metal layer is made of materials of titanium (Ti), platinum (Pt), and gold (Au) stacked in that order. However, no limitation is intended thereby, and the materials may be any materials as far as, when melted solder is applied, the solder spreads on the metal layer made of the materials.

The light transmissive member 80 is secured onto the planar portion 70a by joining a metal thin film 81c (see FIG. 23) provided to draw a ring FIG. 82 on the +Z surface of the planar portion 70a of the ceramic substrate 70, to the metal layer with solder. This is described later in detail.

The light to be incident on the light deflection device 100 passes through the light transmissive member 80 and is incident on the reflecting surface 14 of the movable device 13 in a direction indicated by thick-solid-line arrow 16 in FIGS. 19A and 19B. Rotation of the movable part 120 around the E-axis provides scanning with light as indicated by broken-line arrows. The light passes through the light transmissive member 80 and is emitted from the light deflection device 100. The range indicated by one-dot-chain-line arrow 17 indicates the scanning angle of light using the movable device 13.

FIG. 20 is a perspective view of an example of a configuration of the light deflection device according to the embodiment. FIG. 20 illustrates an example of a pin grid array in which external wiring pins 75 are attached to the -Z surface of the ceramic substrate 70.

As described above, the movable part 120 of the movable device 13 rotates in a reciprocating manner around the E-axis, reflects the light incident in the direction indicated by thick-solid-line arrow 16 using the reflecting surface 14, and hence can perform scanning as indicated by broken lines.

Figure 21:
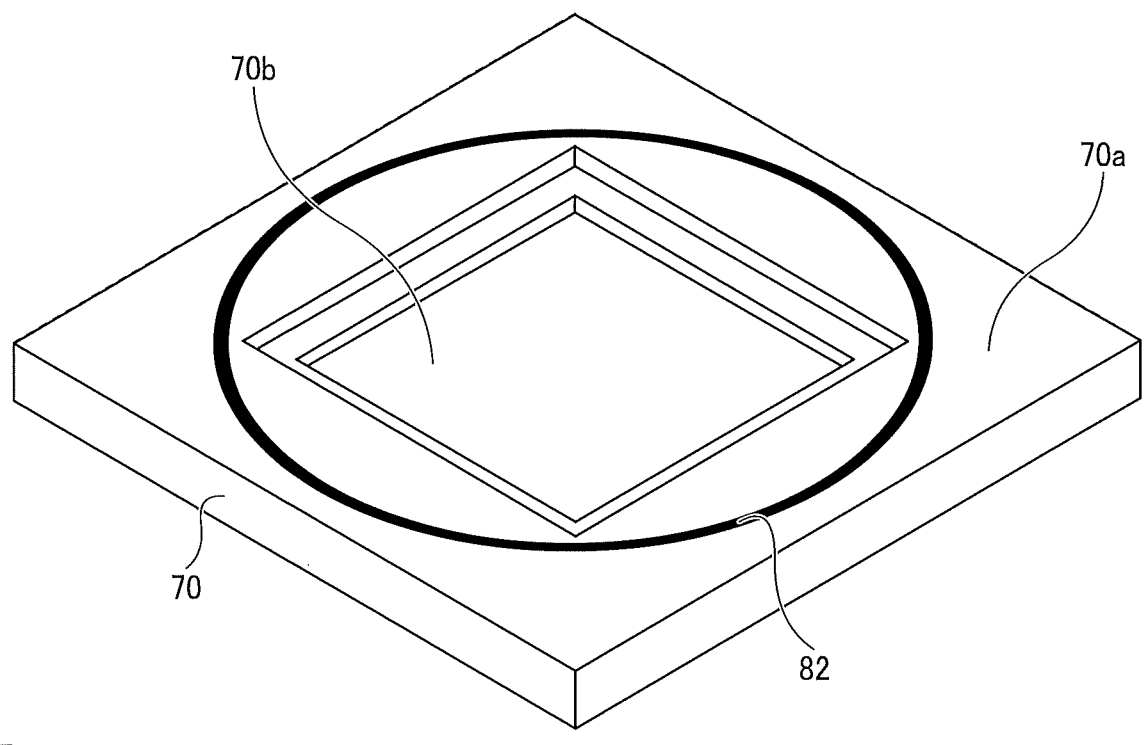
FIG. 21 illustrates an example of a configuration of a ceramic substrate according to the first embodiment.

FIG. 21 illustrates an example of a configuration of the ceramic substrate 70 in the light deflection device 100. As described above, the ceramic substrate 70 has the cavity 70b at the +Z surface of the ceramic substrate 70. The planar portion 70a of the ceramic substrate 70 is provided with the metal thin film 81c to draw the ring FIG. 82. The ring FIG. 82 is an example of "closed figure".

The ring FIG. 82 can be a shape similar to the ring shape of the secured portion of the light transmissive member 80 that is secured onto the planar portion 70a. The function of the ring FIG. 82 is described later in detail.

The metal thin film 81c is made of materials of titanium (Ti), platinum (Pt), and gold (Au) stacked in that order on the planar portion 70a. However, no limitation is intended thereby, and the materials may be any materials as far as, when melted solder is applied, the solder spreads on the metal thin film 81c made of the materials.

Figure 22:
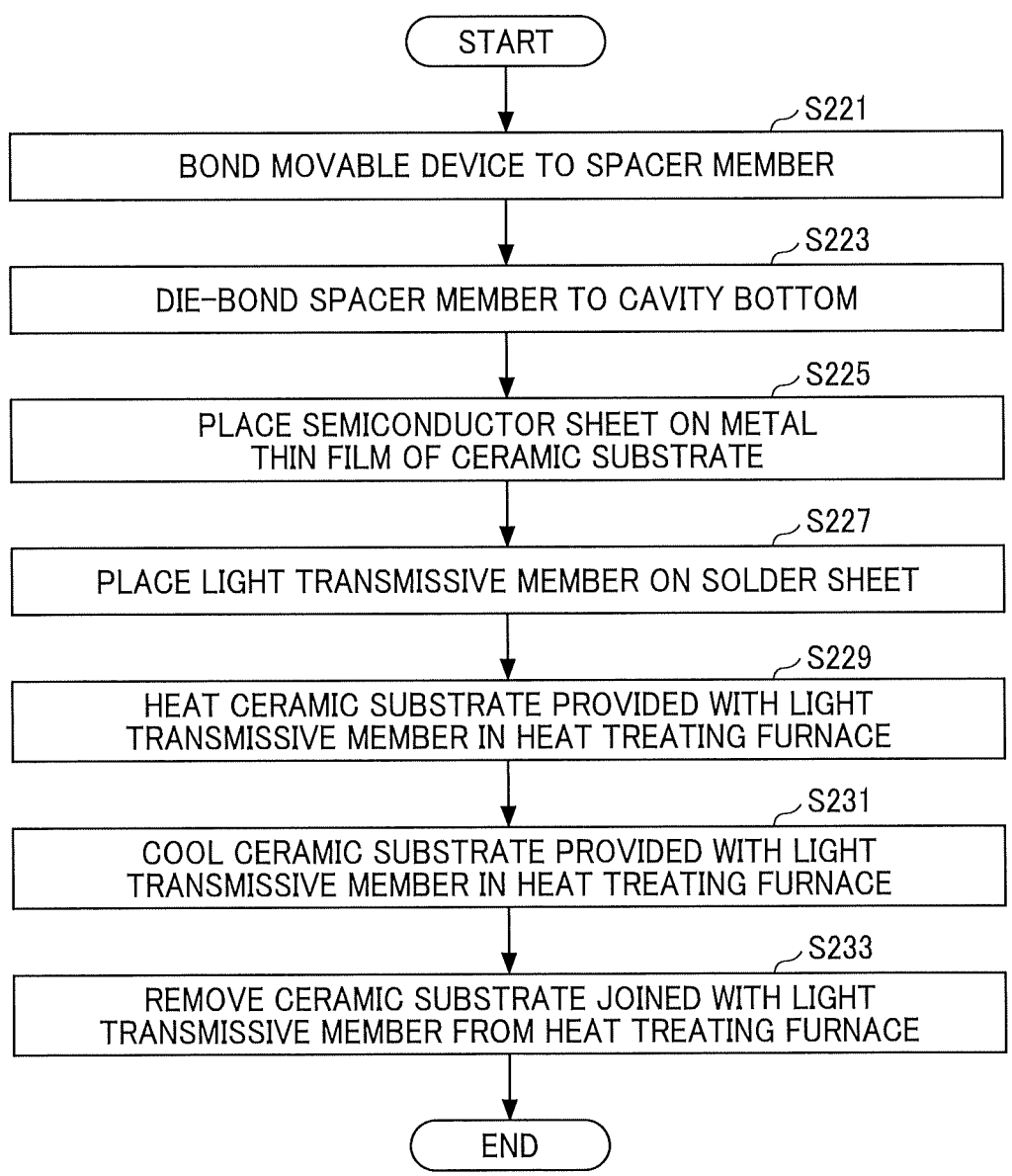
FIG. 22 is a flowchart of an example of a method of manufacturing the light deflection device according to the first embodiment.

Next, a method of manufacturing the light deflection device according to the embodiment is described. FIG. 22 is a flowchart of an example method of manufacturing the light deflection device according to the embodiment.

First, in step S221, the movable device 13 is bonded to the spacer member 71. For bonding, a heat-resistant epoxy adhesive or the like may be used.

Then, in step S223, the spacer member 71 with the movable device 13 bonded is die-bonded to the bottom 70c of the cavity 70b of the ceramic substrate 70 by using a die bonder. At this time, the image of the ring FIG. 82 on the planar portion 70a of the ceramic substrate 70 is recognized, for example, by image capturing with a camera, the spacer member 71 with the movable device 13 bonded is positioned such that the center of the plane of the reflecting surface 14 of the movable device 13 is highly accurately aligned with the center of the ring FIG. 82 serving as a reference. Then, die bonding is performed. Die bonding may use, for example, a heat-resistant epoxy adhesive, gold tin (AuSn), or solder. Die bonding using the image recognition provides positioning accuracy (mount accuracy) of ±30 μm for an example. When a die bonder with further high accuracy is used, positioning accuracy of ±1 μm can be obtained.

Then, in step S225, a ring-shaped semiconductor sheet, the shape being similar to the ring FIG. 82, is placed on the ring FIG. 82 of the planar portion 70a of the ceramic substrate 70. In other words, a solder preform is formed on the ring FIG. 82.

Then, in step S227, the light transmissive member 80 is placed on the ring of the solder sheet.

Then, in step S229, the ceramic substrate 70 provided with the light transmissive member 80 is placed in a heat treating furnace in an atmosphere of inert gas or formic acid and is heated in the furnace. In this case, for example, pre-heating is performed at 220° C. for several tends of seconds, and then main heating is performed at 240° C. By heating, the solder is dissolved.

The solder may be one solder of Sn, silver (Ag), and copper (Cu), or may be any other solder. A heat-resistant material such as aforementioned BK7 glass is used as a material of the light transmissive member 80, thereby preventing deformation and the like of the light transmissive member 80 due to heating.

Then, in step S231, the ceramic substrate 70 provided with the light transmissive member 80 is cooled. By cooling, the dissolved solder is solidified, and the ceramic substrate 70 and the light transmissive member 80 are joined to each other.

Then, in step S233, the ceramic substrate 70 to which the light transmissive member 80 is joined is removed from the heat treating furnace.

The light deflection device 100 can be thus manufactured.

Figure 23:
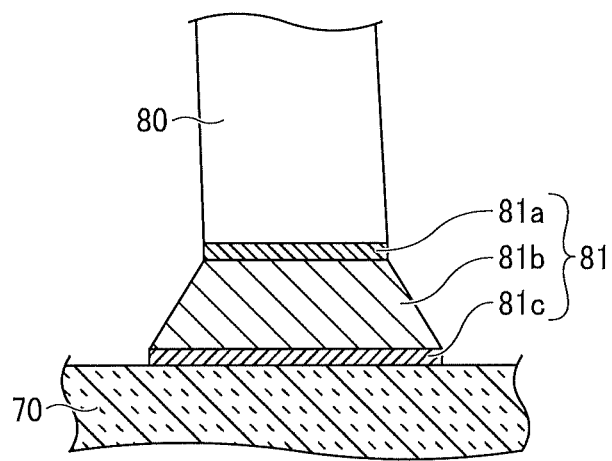
FIG. 23 is an enlarged view of an example of a joint portion between a light transmissive member and a ceramic substrate according to the first embodiment.

FIG. 23 is an enlarged view of an example of the solder joint portion of a metal thin film 81c on the ceramic substrate 70 and a metal layer 81a of the secured portion of the light transmissive member 80. As illustrated in FIG. 23, a solder layer 81b is interposed between the metal thin film 81c and the metal layer 81a, thereby bonding the metal thin film 81c and the metal layer 81a to each other.

Advantageous Effect (Advantageous Effect Caused by Increase in Scanning Angle)

Figure 24:
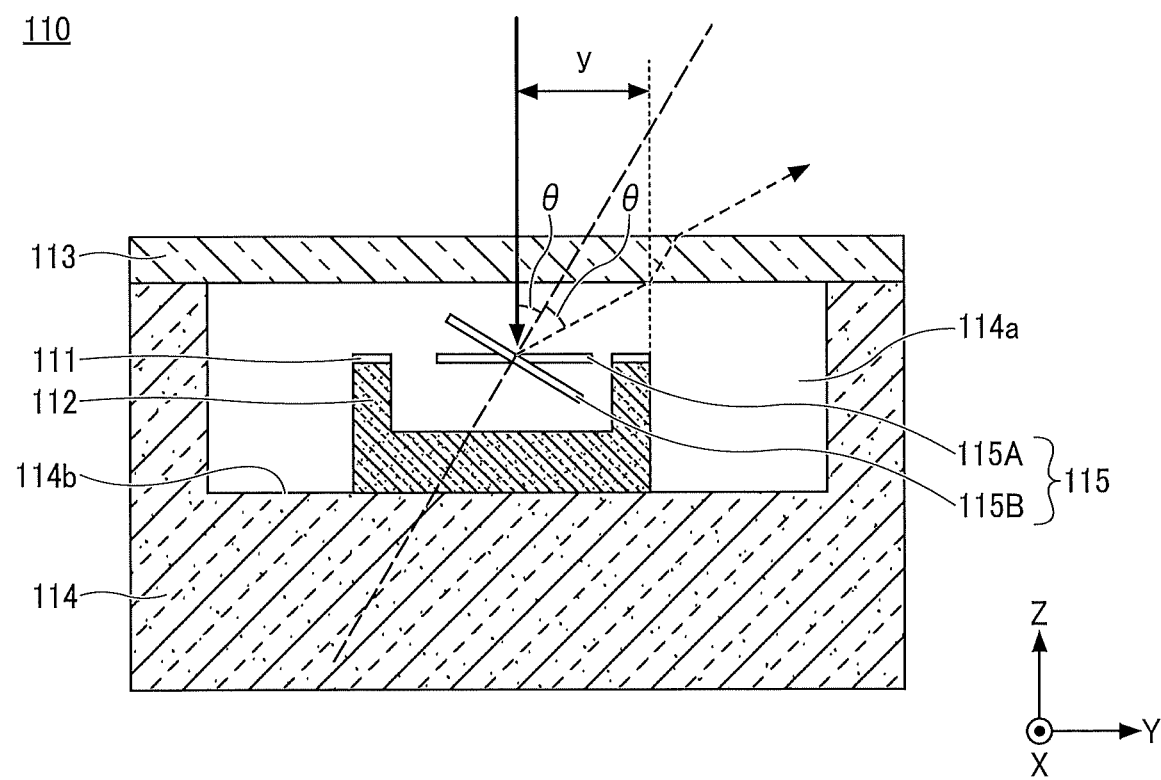
FIG. 24 is a cross-sectional view of a configuration of a light deflection device according to a comparative example.

A comparative example is described now referring to FIG. 24 before the description on the advantageous effects of the embodiment. FIG. 24 is a cross-sectional view of a configuration of a light deflection device according to a comparative example.

A light deflection device 110 includes a movable device 111, an attachment member 112, a light transmissive member 113, and a package member 114. The movable device 111 includes a movable part 115 including a reflecting surface.

The package member 114 has a cavity 114a. The attachment member 112 is secured to a bottom 114b of the cavity 114a. The movable device 111 is attached to the attachment member 112 in a state in which the movable part 115 is rotatable.

The light transmissive member 113 is a plate-shaped member made of a transparent material such as glass, and is secured to the +Z surface of the package member 114 so as to cover the movable device 111. The light transmissive member 113 has a function of protecting the movable device 111 from adhesion of dusts and the like; and a function serving as a window portion that allows reflected light to be incident thereon and to be emitted therefrom.

In FIG. 24, the incident light indicated by a thick-solid-line arrow advances in the −Z direction, passes through the light transmissive member 113, and is incident on the reflecting surface of the movable device 115. In this case, the movable part 115A is in a state in which the reflecting surface is perpendicular to the Z direction, and the movable part 115B is in a state in which the reflecting surface is deflected by a deflection angle θ with respect to the Z direction (rotated state). The light reflected by the movable part 115B is reflected in a direction at an angle 2θ with respect to the Z direction as indicated by a broken-line arrow.

It is assumed that a length y is the length from the center of the reflecting surface of the movable part 115 to the position at which the light reflected by the reflecting surface is incident on the −Z surface of the light transmissive member 113. When the length y increases because of the deflection of the reflecting surface, the reflected light is blocked by the package member 114 located in the +Y direction and the −Y direction of the movable part 115, and the reflected light is not emitted from the light deflection device 110. In other words, the length y is a length required for the light to be emitted, the light which is incident on the light deflection device 110 and used for scanning performed by the light deflection device, without being blocked by a member included in the light deflection device 110.

When the length of the movable part 115 in the Y direction is 4 mm, the distance from the reflecting surface in the state perpendicular to the Z direction to the −Z surface of the light transmissive member 113 is 2 mm, and the deflection angle θ is 22.5 degrees, the length y is 2 mm. In this case, the angle 2θ of the light reflected by the reflecting surface with respect to the Z direction is 45 degrees, and the scanning angle ±2θ of light by the movable part 115 is 90 degrees. When the deflection angle θ is 40 degrees, the scanning angle ±2θ is 160 degrees and the length y is 11.3 mm.

As described above, in the light deflection device 110 according to the comparative example, the length y varies due to the deflection angle of the movable part 115 of the movable device 111. To attain a larger scanning angle by the light deflection device, the length y has to be increased, and hence the size of the light deflection device 110 in the Y direction increases in accordance with the increase in the length y.

In contrast, according to the embodiment, the height (the length in the Z direction) of the spacer member 71 is adjusted so that the light reflection position in the Z direction when light is incident on the reflecting surface 14 of the movable part 120 is equal to the height of the planar portion 70a. In other words, the movable part 120 of the light deflection device 100 includes the reflecting surface 14 that reflects light at a height equal to the height of the planar portion 70a. Moreover, the light transmissive member 80 including a hollow hemispherical shape covers the movable part 120 of the movable device 13 and is secured to the planar portion 70a of the ceramic substrate 70.

With the configuration, a member that blocks light does not exist in the +Y direction and −Y direction of the reflecting surface 14, thereby eliminating the limitation caused by the length y. Thus, a large scanning angle can be attained. For example, the light scanning direction ±2θ may be 180 degrees.

However, the light reflection position in the Z direction when light is incident on the reflecting surface 14 is not limited to the position at the height equal to the height of the planar portion 70a. The light reflection position may be any position that is at a height equal to or higher than the height of the planar portion 70a, or in other words, that includes the position of the planar portion 70a and is a position on the +Z side with respect to the planar portion 70a. As the height of the light reflection position is higher than the height of the planar portion 70a, the scanning angle can be increased.

In addition, the light transmissive member 80 may not include the hollow hemispherical shape, as far as the light transmissive member 80 can cover the movable part 120 having the reflecting surface 14 that reflects light at a height equal to the height of the planar portion 70a. The light transmissive member 80 may have any of various shapes like modifications (described later).

In the manufacturing method according to the embodiment, temporary arrangement is provided such that the center of the ring FIG. 82 provided by the metal thin film 81c on the ceramic substrate 70 is aligned with the plane center of the reflecting surface 14 with high accuracy, and then the solder interposed between the metal thin film 81c and the metal layer provided at the secured portion of the light transmissive member 80 is dissolved. Accordingly, when the solder is dissolved with heat, the surface area of the solder spreading between the metal thin film 81c and the metal layer increases, thereby generating large surface tension. The effect of surface tension provides a self-alignment effect that reduces a positional deviation from the temporary arrangement. The positional deviation between the light transmissive member 80 and the ceramic substrate 70 during solder bonding is reduced, and the center of curvature of the hemisphere of the light transmissive member 80 can be aligned with the reflection position of the incident light that is incident on the reflection surface 14 of the movable device 13.

Since the center of curvature of the hemisphere of the light transmissive member 80 is aligned with the reflection position of the incident light that is incident on the reflecting surface 14 of the movable device 13, the scanning light by the reflecting surface 14 can be incident on the surface of the light transmissive member 80 substantially perpendicularly. Thus, refraction is prevented when the scanning light passes through the light transmissive member 80, thereby increasing the position accuracy of the scanning light. In addition, stray light caused by multiple reflection at the light transmissive member 80 is reduced and a defect such as a double dot generated when scanning light overlaps each other by multiple reflection can be prevented from occurring.

Moreover, since the self-alignment effect is used, the positioning adjustment does not take a time, or a positioning device with high accuracy is not required, thereby attaining high productivity with low cost.

The ring FIG. 82 is desirably similar to the ring of the secured portion of the light transmissive member 80, the outer diameter of the ring FIG. 82 is desirably larger than the outer diameter of the ring of the secured portion of the light transmissive member 80, and the inner diameter of the ring FIG. 82 is desirably smaller than the inner diameter of the ring of the secured portion of the light transmissive member 80. Thus, when the solder bonding is ended, the ring of the secured portion of the light transmissive member 80 can be disposed inside the ring FIG. 82, thereby efficiently attaining the self-alignment effect.

The outer diameter and the inner diameter of the ring FIG. 82 are determined such that the height of the center of curvature of the hemisphere of the light transmissive member 80 is aligned with the height of the plane center of the reflecting surface 14, in accordance with the thickness of the solder layer that is obtained such that the solder in the preform state is dissolved and spread, and then is cooled and solidified. The thickness of the solder in the preform state is preferably about 30 μm.

To further prevent the positional deviation between the ceramic substrate 70 and the light transmissive member 80 during solder bonding, a temporary securing jig may be used. For example, a temporary securing jig is disposed on the ceramic substrate 70. The temporary securing jig has a ring portion having a larger diameter than the diameter of the ring of the secured portion of the light transmissive member 80. A semiconductor sheet and the light transmissive member 80 are disposed within the ring portion of the temporary securing jig, are heated, and thus are joined to each other by solder bonding. The temporary securing jig stops movement of the solder and the light transmissive member 80 after the solder is dissolved with heat. A positional deviation so large that the self-alignment effect is not obtained can be prevented, and the self-alignment effect can be efficiently obtained.

Moreover, the manufacturing method in FIG. 22 may be arranged in batch processing, thereby further increasing the productivity.

First Modification

A first modification of the first embodiment provides an example in which a light transmissive member includes a hollow conical shape. The description on components identical with those in the above-described embodiment may be omitted.

Figure 25A:
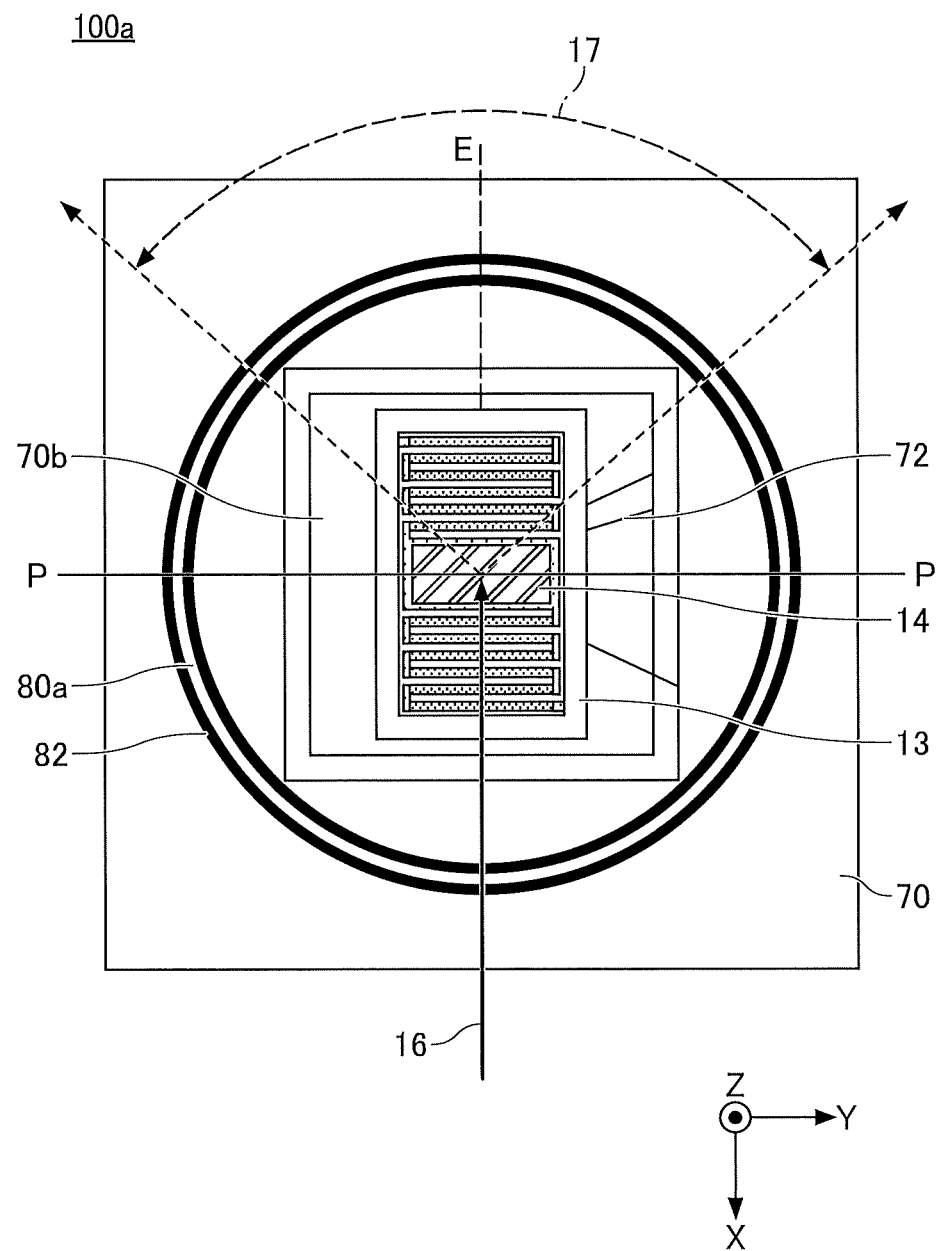
FIGS. 25A and 25B each illustrate an example of a configuration of a light deflection device according to a first modification of the first embodiment, FIG. 25A being a plan view, FIG. 25B being a cross-sectional view taken along line P-P in FIG. 25A.
Figure 25B:
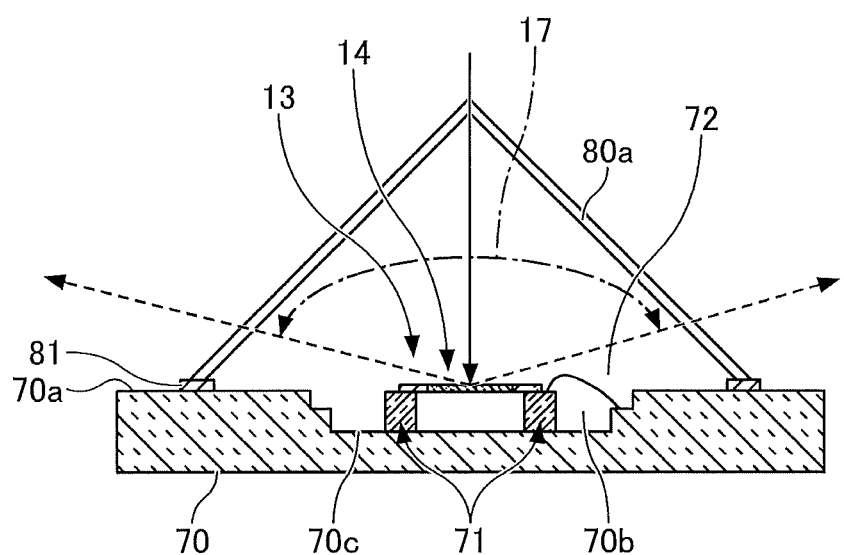
Figure 25B:
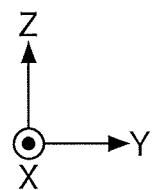

FIGS. 25A and 25B each illustrate an example of a configuration of a light deflection device 100a according to the first modification, FIG. 25A being a plan view, FIG. 25B being a cross-sectional view taken along line P-P in FIG. 25A.

As illustrated in FIGS. 25A and 25B, the light deflection device 100a includes a light transmissive member 80a including a hollow conical shape. The light transmissive member 80a can cover the movable part 120 having the reflecting surface 14 that reflects light at a position at a height equal to or higher than the height of the planar portion 70a. Thus, the movable device 13 can be protected and the scanning angle can be expanded as described in the first embodiment.

Moreover, with the modification, as described in the first embodiment, the spacer member 71 to which the movable device 13 is secured can be positioned with high accuracy with reference to the center of the ring FIG. 82. Furthermore, with the self-alignment effect during solder bonding, the light transmissive member 80a can be properly disposed on the planar portion 70a of the ceramic substrate 70.

Second Modification

A second modification of the first embodiment provides an example in which a light transmissive member includes a hollow cylindrical shape having a cylinder axis direction in a direction intersecting with a planar portion of a ceramic substrate.

Figure 26A:
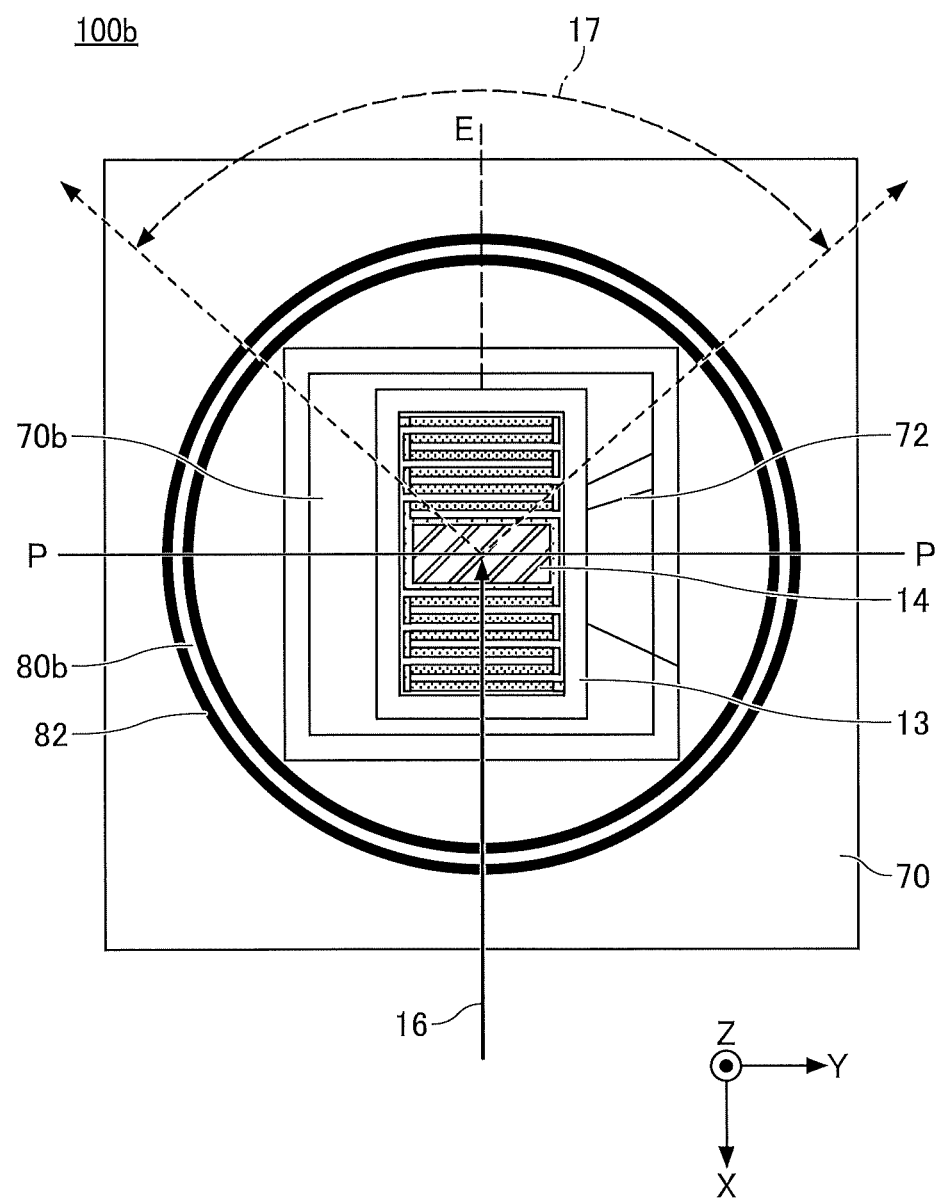
FIGS. 26A and 26B each illustrate an example of a configuration of a light deflection device according to a second modification of the first embodiment, FIG. 26A being a plan view, FIG. 26B being a cross-sectional view taken along line P-P in FIG. 26A.
Figure 26B:
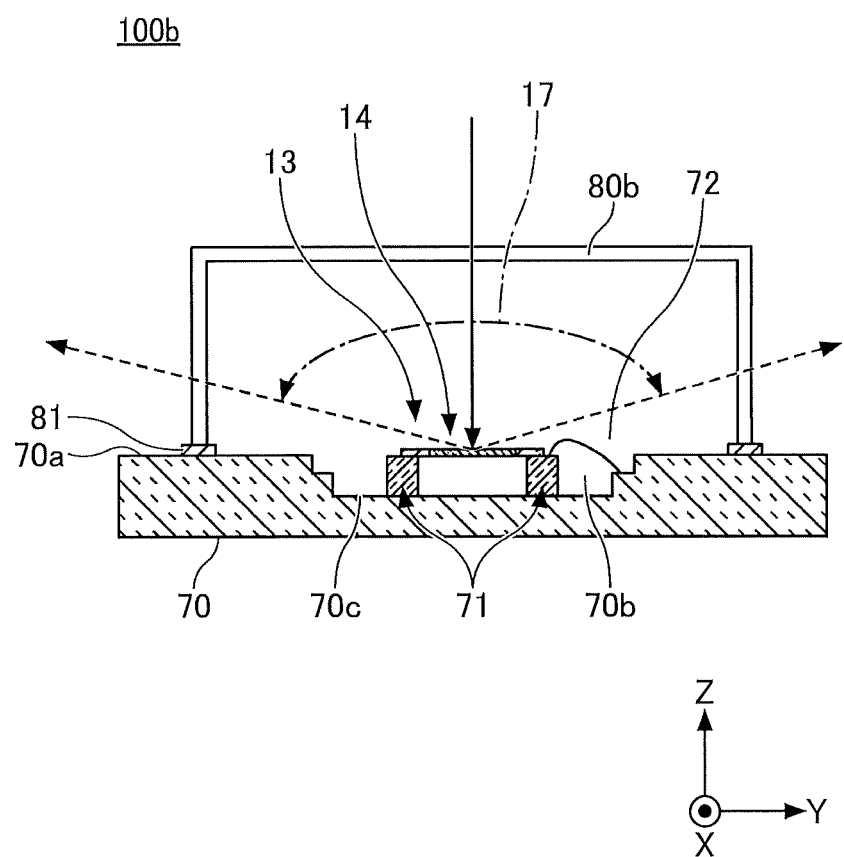

FIGS. 26A and 26B each illustrate an example of a configuration of a light deflection device 100b according to the second modification, FIG. 26A being a plan view, FIG. 26B being a cross-sectional view taken along line P-P in FIG. 26A.

As illustrated in FIGS. 26A and 26B, the light deflection device 100b includes a light transmissive member 80b including a hollow cylindrical shape having a cylinder axis direction in a direction intersecting with the planar portion 70a of the ceramic substrate 70. The light transmissive member 80b can cover the movable part 120 having the reflecting surface 14 that reflects light at a position at a height equal to or higher than the height of the planar portion 70a. Thus, the movable device 13 can be protected and the scanning angle can be expanded as described in the first embodiment.

Moreover, with the modification, as described in the first embodiment, the spacer member 71 to which the movable device 13 is secured can be positioned with high accuracy with reference to the center of the ring FIG. 82. Furthermore, with the self-alignment effect during solder bonding, the light transmissive member 80a can be properly disposed on the planar portion 70a of the ceramic substrate 70.

Third Modification

A third modification of the first embodiment provides an example in which a light transmissive member includes a hollow hemicylindrical shape having a cylinder axis direction in a direction along a rotation axis of a movable part.

Figure 27A:
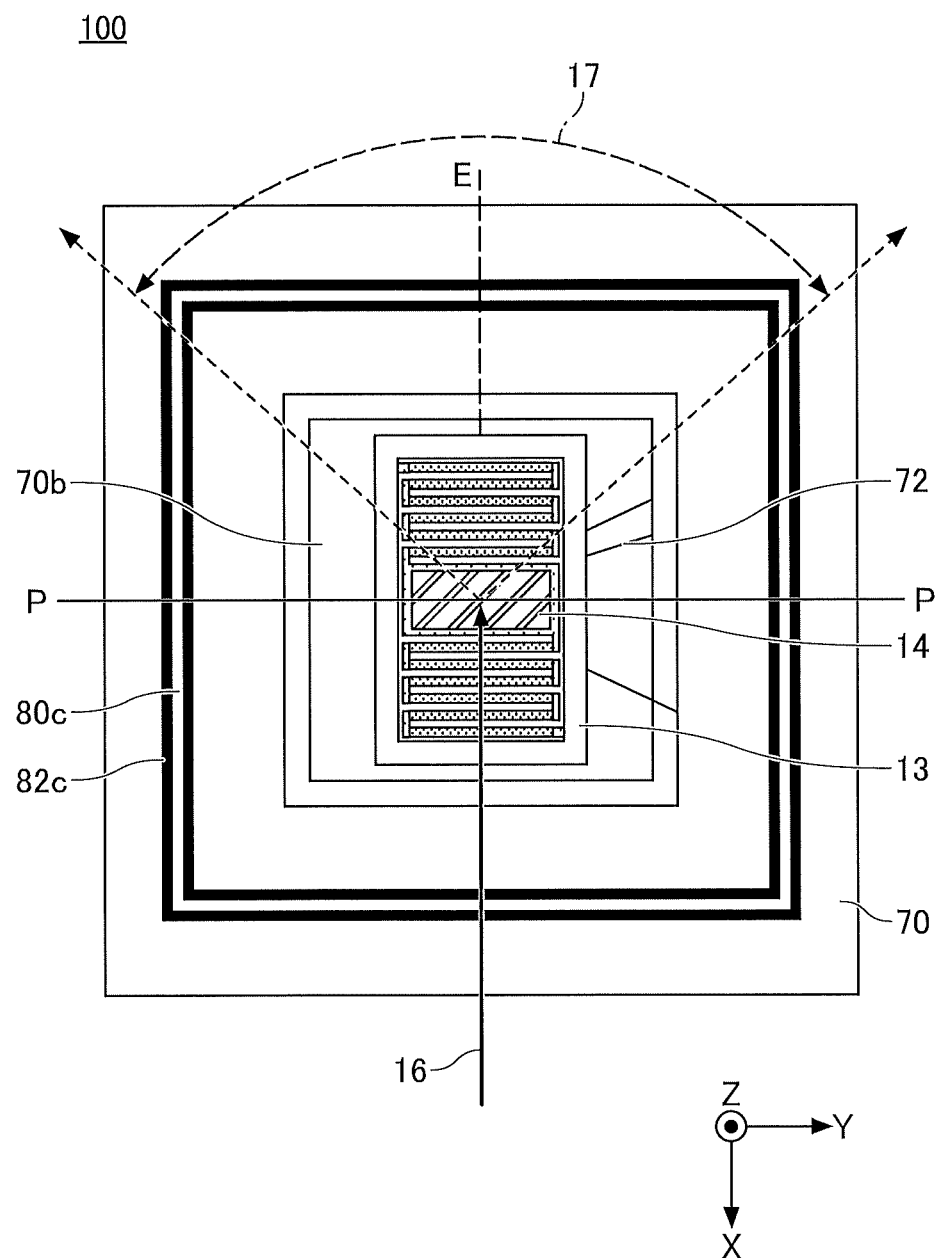
FIGS. 27A and 27B each illustrate an example of a configuration of a light deflection device according to a third modification of the first embodiment, FIG. 27A being a plan view, FIG. 27B being a cross-sectional view taken along line P-P in FIG. 27A.
Figure 27B:
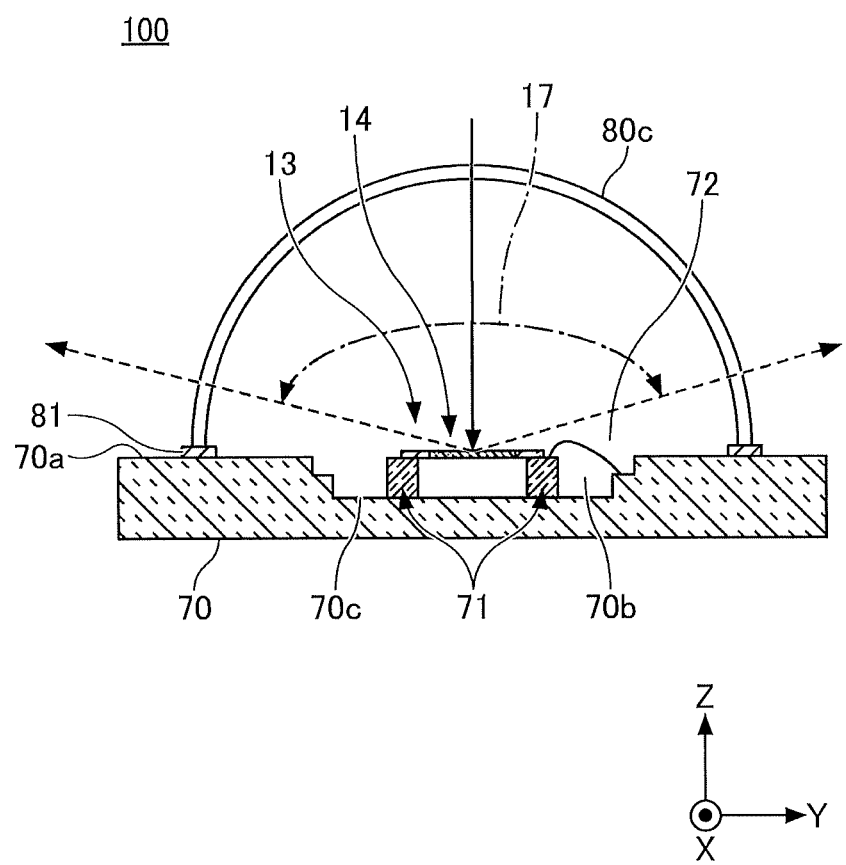

FIGS. 27A and 27B each illustrate an example of a configuration of a light deflection device 100c according to the third modification, FIG. 27A being a plan view, FIG. 27B being a cross-sectional view taken along line P-P in FIG. 27A.

As illustrated in FIGS. 27A and 27B, the light deflection device 100c includes a light transmissive member 80c including a hollow hemicylindrical shape having a cylinder axis direction in a direction along the E-axis that is a rotation axis of the movable part 120 of the movable device 13. A rectangle FIG. 82c is formed using the metal thin film 81c on the planar portion 70a of the ceramic substrate 70. The light transmissive member 80c is secured onto the rectangle FIG. 82c by solder bonding. The rectangle FIG. 82c is an example of "closed figure".

The light transmissive member 80c can cover the movable part 120 having the reflecting surface 14 that reflects light at a position at a height equal to or higher than the height of the planar portion 70a. Thus, the movable device 13 can be protected and the scanning angle can be expanded as described in the first embodiment.

Moreover, with the modification, the spacer member 71 to which the movable device 13 is secured can be positioned with high accuracy with reference to, for example, the center, each side, or each corner of the rectangle FIG. 82c. Furthermore, with the self-alignment effect during solder bonding, the light transmissive member 80a can be properly disposed on the planar portion 70a of the ceramic substrate 70.

For example, the reflection position of the incident light on the reflecting surface 14 of the movable device 13 is disposed on the cylinder axis of the light transmissive member 80c. Accordingly, as described in the first embodiment, refraction is prevented when the scanning light passes through the light transmissive member 80c, thereby increasing the position accuracy of the scanning light. In addition, stray light caused by multiple reflection at the light transmissive member 80c is reduced and a defect such as a double dot generated when scanning light overlaps by multiple reflection can be prevented from occurring.

Second Embodiment

Figure 28:
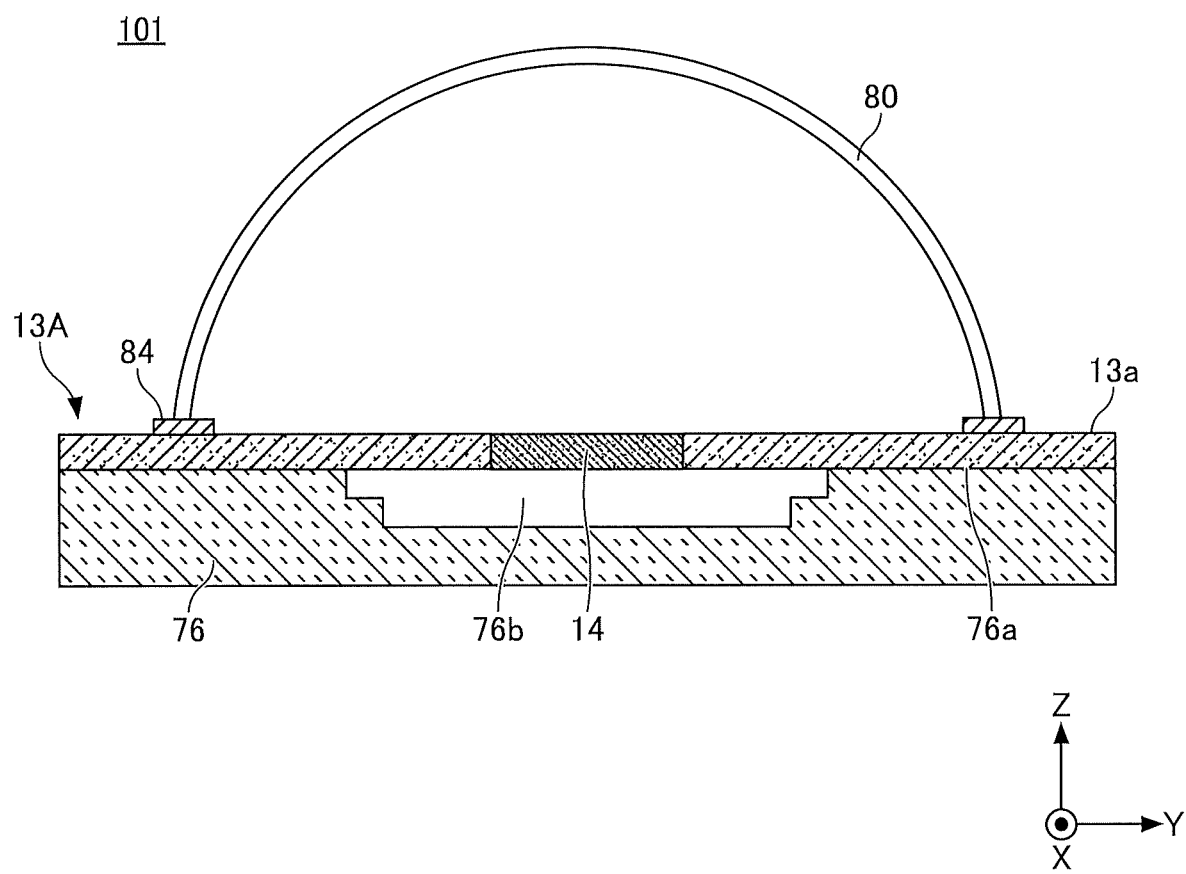
FIG. 28 is a cross-sectional view of an example of a configuration of a light deflection device according to a second embodiment.
Figure 29:
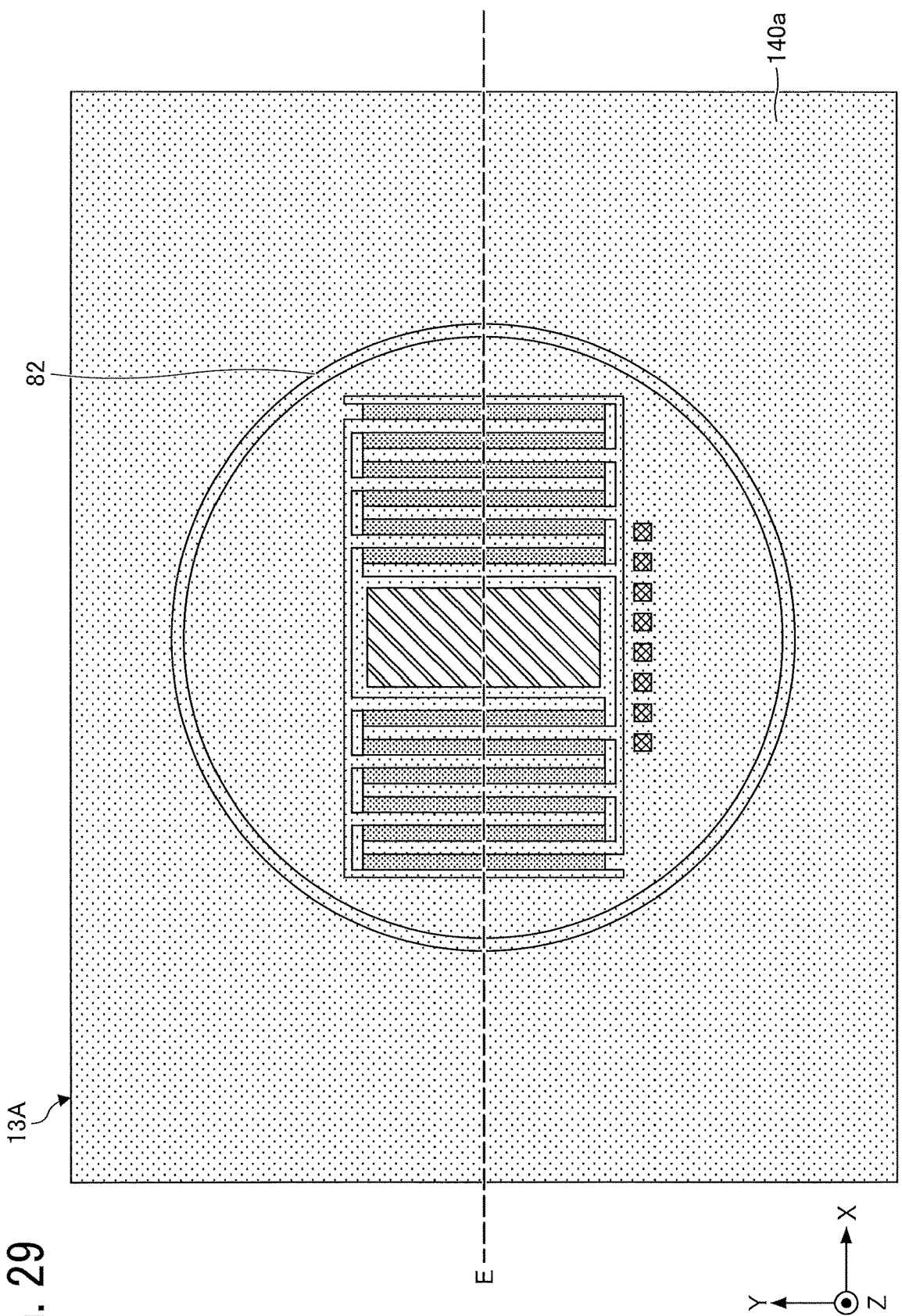
FIG. 29 is a plan view of an example of a configuration of a movable device according to the second embodiment.

Next, a light deflection device according to a second embodiment is described referring to FIGS. 28 and 29. The description on components identical with those in the above-described embodiment may be omitted.

FIG. 28 is a cross-sectional view of an example of a configuration of a light deflection device 101 according to the embodiment.

As illustrated in FIG. 28, the light deflection device 101 includes a ceramic substrate 76, a movable device 13A, and a light transmissive member 80.

The ceramic substrate 76 is a substrate formed by stacking a plurality of ceramic layers. The ceramic substrate 76 has a cavity 76b at the +Z surface of the ceramic substrate 76. The ceramic substrate 76 includes a planar portion 76a at the +Z surface of the ceramic substrate 76. The planar portion 76a corresponds to a portion where the cavity 76b is not formed. The ceramic substrate 76 is an example of "substrate", the cavity 76b is an example of "recess" (depression), and the planar portion 76a is an example of "first planar portion".

The movable device 13A is secured onto the planar portion 76a. The cavity 76b ensures the space in which the movable part 120 of the movable device 13A rotates.

FIG. 29 is a plan view of an example of a configuration of the movable device 13A according to the embodiment. The movable device 13A includes a supporting section 140a having a larger area than the area of the supporting section 140 of the movable device 13 according to the first embodiment. The supporting section 140a includes a planer portion 13a at the +Z surface of the supporting section 140a. A ring FIG. 82 is formed using a metal thin film 81c on the planar portion 13a. The planar portion 13a is an example of "second planar portion".

The light transmissive member 80 made of a transparent material and including a hollow hemispherical shape is provided on or above the ring FIG. 82 of the planar portion 13a and is secured to cover the movable device 13A. The light transmissive member 80 and the ring FIG. 82 have functions similar to those described above.

The ring FIG. 82 is formed on the supporting section 140a made of a semiconductor such as Si. This provides spreading effect of solder for self-alignment similarly to the case where the ring FIG. 82 is formed on the ceramic substrate 70.

The movable part 120 of the movable device 13A is supported by the supporting section 140a such that the reflection position of the incident light by the reflecting surface 14 included in the movable part 120 is at a height equal to or higher than the height of the planar portion 13*a* included in the supporting section 140*a*. The light transmissive member 80 is secured onto the planar portion 13*a*.

With the above-described configuration, advantageous effects similar to those described in the first embodiment can be obtained. Moreover, the light transmissive member 80 can be further downsized as long as the light transmissive member 80 can cover the movable part 120, and the cavity 76*b* can be further downsized as long as the cavity 76*b* can ensure the space for rotation of the movable part 120.

In the embodiment, since the movable device 13A is directly secured to the ceramic substrate 76 and the light transmissive member 80 is directly secured onto the supporting section 140*a*, by downsizing the configurations such as the light transmissive member 80 and the cavity 76*b*, the entirety of the light deflection device 101 can be downsized. In addition, since the number of components can be decreased, the manufacturing time and cost can be decreased, and errors of the components are not accumulated, thereby increasing positioning accuracy and assembling accuracy of the components.

Third Embodiment

Figure 30A:
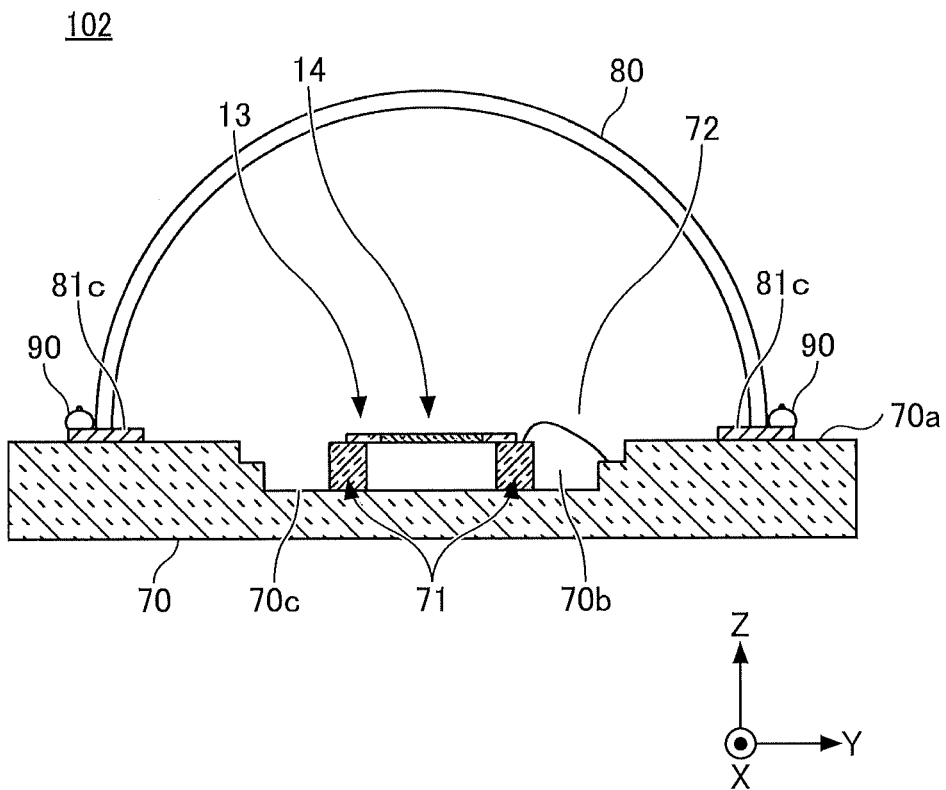
FIGS. 30A and 30B each illustrate an example of a configuration of a light deflection device according to a third embodiment, FIG. 30A being a cross-sectional view, FIG. 30B being an enlarged view of an example of a joint portion between a light transmissive member and a ceramic substrate.
Figure 30B:
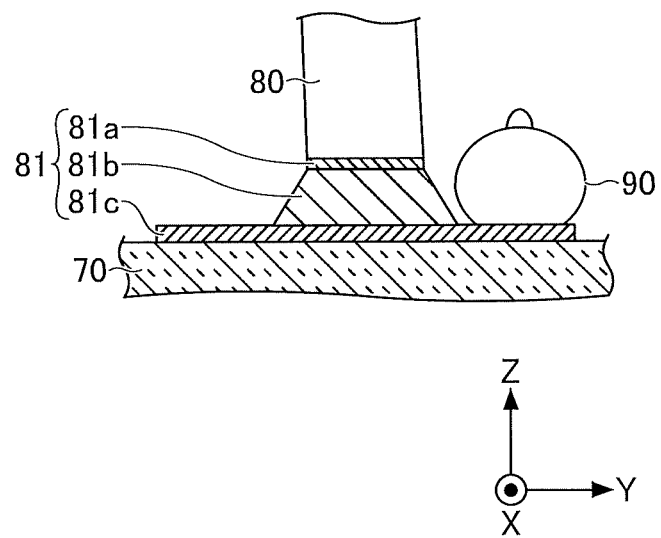

Next, a light deflection device according to a third embodiment is described referring to FIGS. 30A and 30B.

FIGS. 30A and 30B each illustrate an example of a configuration of a light deflection device 102 according to the embodiment, FIG. 30A being a cross-sectional view, FIG. 30B being an enlarged view of a joint portion between a light transmissive member and a ceramic substrate.

As illustrated in FIGS. 30A and 30B, in the light deflection device 102, three protrusions 90 are provided on the metal thin film 81*c* forming the ring FIG. 82, at positions outside the light transmissive member 80. The protrusions 90 are, for example, gold bumps. The number of the protrusions 90 is not limited to three and may be a larger number.

Regarding the light deflection device according to the embodiment, the light transmissive member 80 is temporarily disposed on a semiconductor sheet disposed on the ceramic substrate 70, and in this state the ceramic substrate 70 is moved to the inside of the heat treating furnace. At this time, the position of the light transmissive member 80 may be deviated from the temporarily disposed state by an impact or the like.

In addition, a movable device may be installed in a package member in a vacuum or a package member filled with a gas such as nitrogen, for example, to prevent entry of moisture and oxidization of components. In the configuration in FIGS. 30A and 30B for example, the movable device 13 is installed in the light transmissive member 80, and the inside of the light transmissive member 80 is evacuated or filled with a gas such as nitrogen.

In this case, the light transmissive member 80 is temporarily disposed on the solder sheet disposed on the ceramic substrate 70, and in this state the evacuation or gas filling is performed. At this time, the light transmissive member 80 may be moved by a force generated during the evacuation or gas filling, and the position of the light transmissive member 80 may be deviated from the temporarily disposed state.

To avoid the positional deviation, the protrusions 90 are provided in the embodiment, and the outer side of the temporarily disposed light transmissive member 80 is pressed by the protrusions 90 to prevent the movement of the light transmissive member 80 by the force generated during the evacuation or gas filling. Thus, the positional deviation of the light transmissive member 80 from the temporarily disposed state can be prevented.

Advantageous effects other than those described above are similar to those described in the first embodiment.

Although the embodiments of the present disclosure have been described above, the present disclosure is not limited to such specific embodiments, and various other embodiments may be used without departing from the spirit and scope of the present disclosure as set forth in the appended claims.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

The invention claimed is:

1. A light deflection device comprising:
    a substrate including a planar portion and a recess;
    a spacer member disposed at a bottom of the recess;
    a supporting section disposed on the spacer member;
    a movable part rotatably supported by the supporting section and having a reflecting surface configured to reflect light at a height equal to or higher than a height of the planar portion; and
    a light transmissive member disposed on the planar portion and covering the movable part,
    wherein a closed figure using a metal thin film is formed on the planar portion,
    wherein a metal layer is provided at a secured portion of the light transmissive member, the secured portion being configured to be secured onto the planar portion, and
    wherein the metal thin film of the closed figure is joined to the metal layer of the secured portion with solder and hence the light transmissive member is secured onto the closed figure.

2. The light deflection device according to claim 1, wherein at least three protrusions are formed on the closed figure, at positions outside the light transmissive member.

3. The light deflection device according to claim 1, wherein the closed figure is a ring figure.

4. The light deflection device according to claim 1, wherein the light transmissive member includes a hollow hemispherical shape.

5. The light deflection device according to claim 1, wherein the light transmissive member includes a hollow conical shape.

6. The light deflection device according to claim 1, wherein the light transmissive member includes a hollow cylindrical shape having a cylinder axis direction in a direction intersecting with the planar portion.

7. The light deflection device according to claim 1, wherein the light transmissive member includes a hollow hemicylindrical shape having a cylinder axis direction in a direction along a rotation axis of the movable part.

8. The light deflection device according to claim 1, further comprising:
    a pair of drive beams each having an end coupled to the movable part, and configured to rotatably support the movable part with the movable part disposed between the pair of drive beams,
    wherein the movable part is rotatably supported by the supporting section via the pair of drive beams.

9. A distance measurement device comprising:
the light deflection device according to claim 1.
10. A mobile body comprising:
the distance measurement device according to claim 9.

\* \* \* \* \*